(12) United States Patent
Hoya et al.

(10) Patent No.: US 6,930,908 B2
(45) Date of Patent: Aug. 16, 2005

(54) SEMICONDUCTOR INTEGRATED CIRCUIT DEVICE HAVING FERROELECTRIC CAPACITOR

(75) Inventors: Katsuhiko Hoya, Yokohama (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/721,420

(22) Filed: Nov. 26, 2003

(65) Prior Publication Data

US 2005/0013156 A1 Jan. 20, 2005

(30) Foreign Application Priority Data

Jul. 18, 2003 (JP) ........................................ 2003-198953

(51) Int. Cl.[7] .............................................. G11C 11/22
(52) U.S. Cl. .............. 365/145; 365/230.03; 365/230.06
(58) Field of Search ........................... 365/145, 230.03, 365/230.06, 149

(56) References Cited

U.S. PATENT DOCUMENTS 6,366,490 B1   4/2002   Takeuchi et al.
6,507,510 B2 * 1/2003   Takashima .................. 365/145

OTHER PUBLICATIONS

D. Takashima, et al., "High–Density Chain Ferroelectric Random–Access Memory (CFRAM)", Symposium on VLSI Circuits Digest of Technical Papers, 1997, pp. 83–84.

* cited by examiner

*Primary Examiner*—Huan Hoang
(74) *Attorney, Agent, or Firm*—Oblon, Spivak, McClelland, Maier & Neustadt, P.C.

(57) ABSTRACT

A semiconductor integrated circuit device includes unit cells, memory cell blocks, bit lines, word lines, block select signal lines, plate lines, and a plate line driver. The unit cell includes a cell transistor and a ferroelectric capacitor connected between a source and a drain of the cell transistor. The memory cell block includes the unit cells connected in series between a first terminal and a second terminal and a block select transistor connected between the second terminal and a third terminal. The bit line connects commonly the third terminals of the blocks. The word line connects commonly gates of cell transistors in the blocks. The block select signal line connects commonly gates of block select transistors in the blocks. The plate line connects commonly the first terminals of the blocks. The plate line driver is connected to the plate lines and applies a potential to the plate lines.

13 Claims, 17 Drawing Sheets

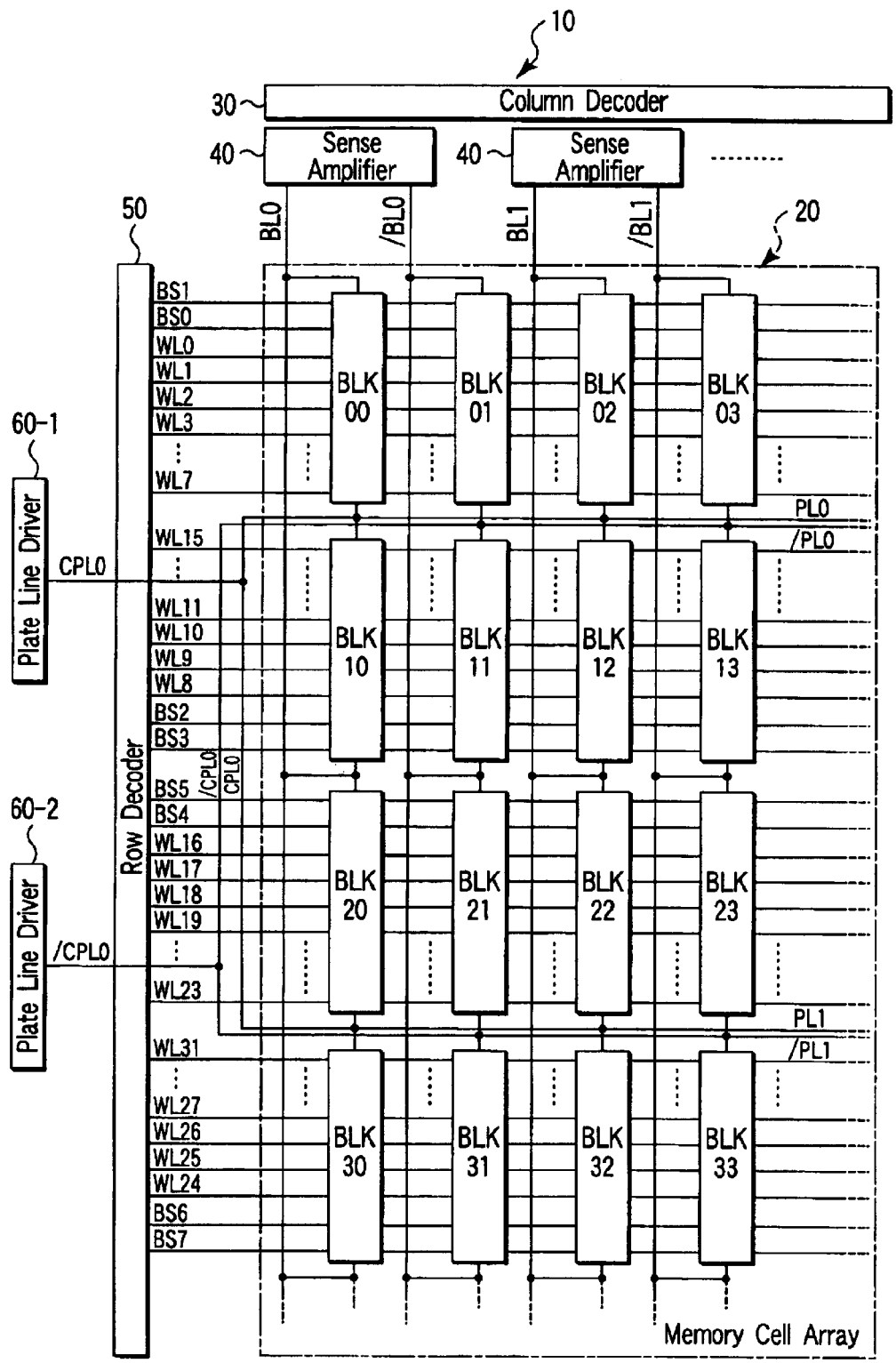
F I G. 1

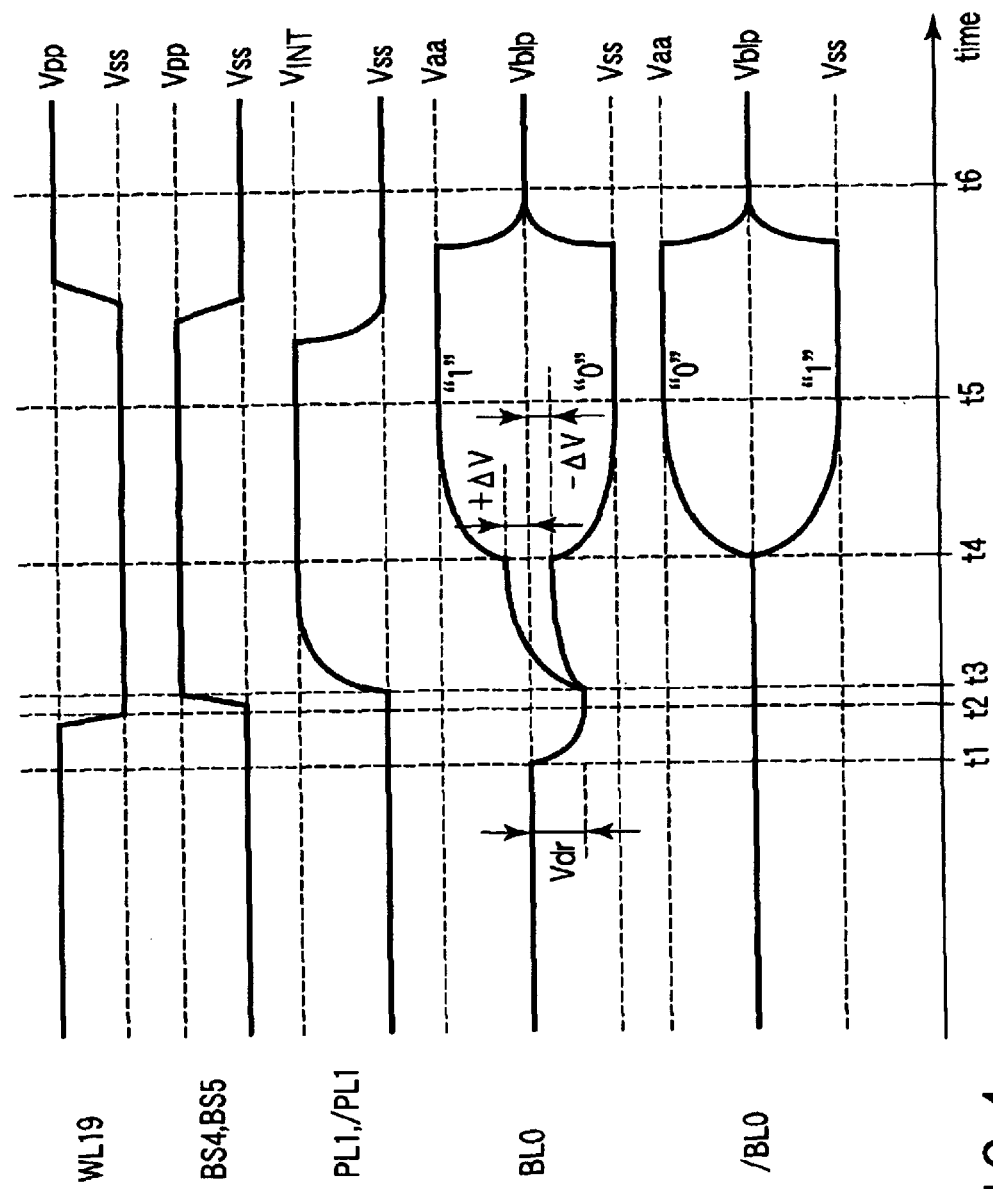
F I G. 4

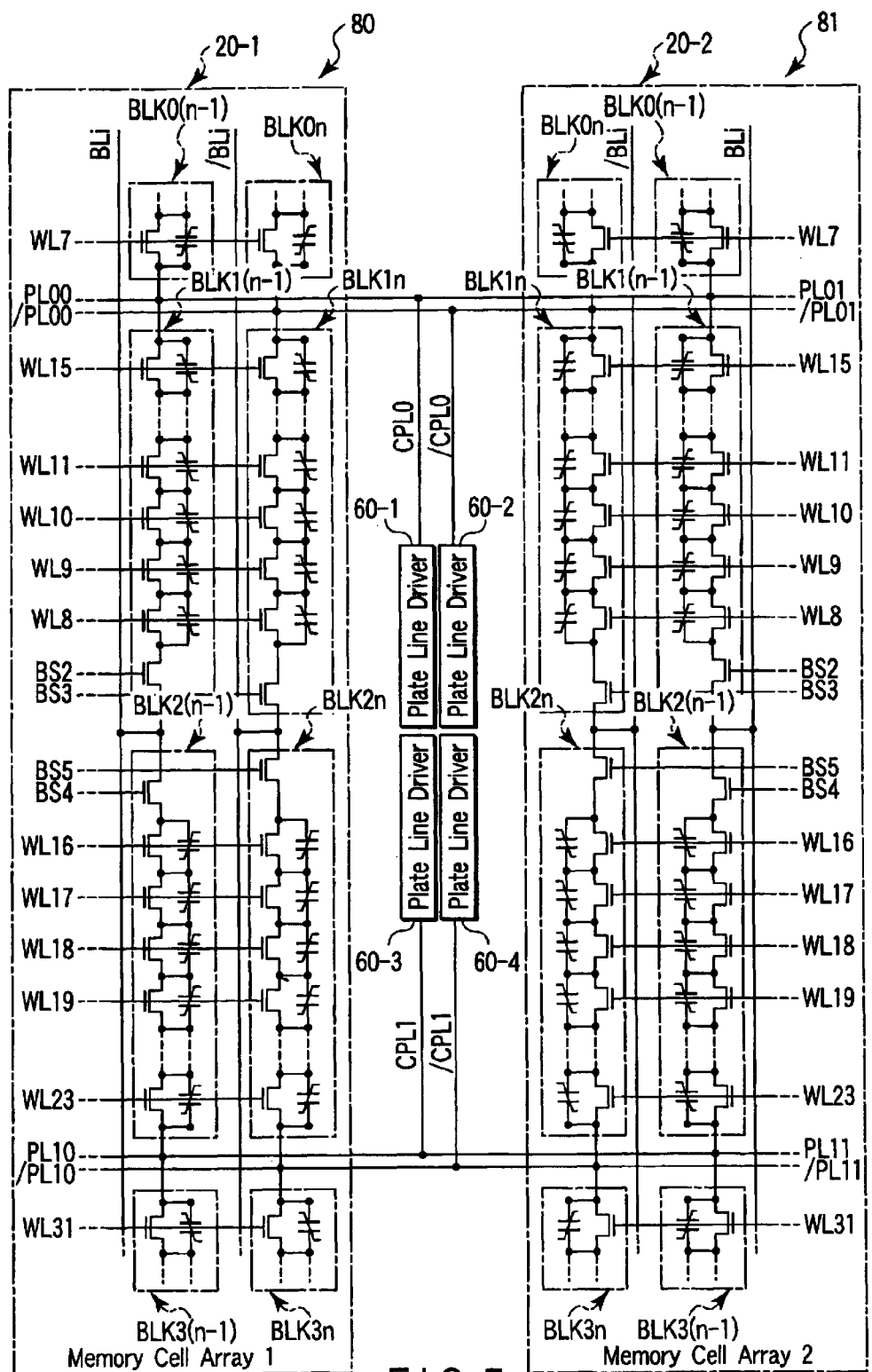
F I G. 7

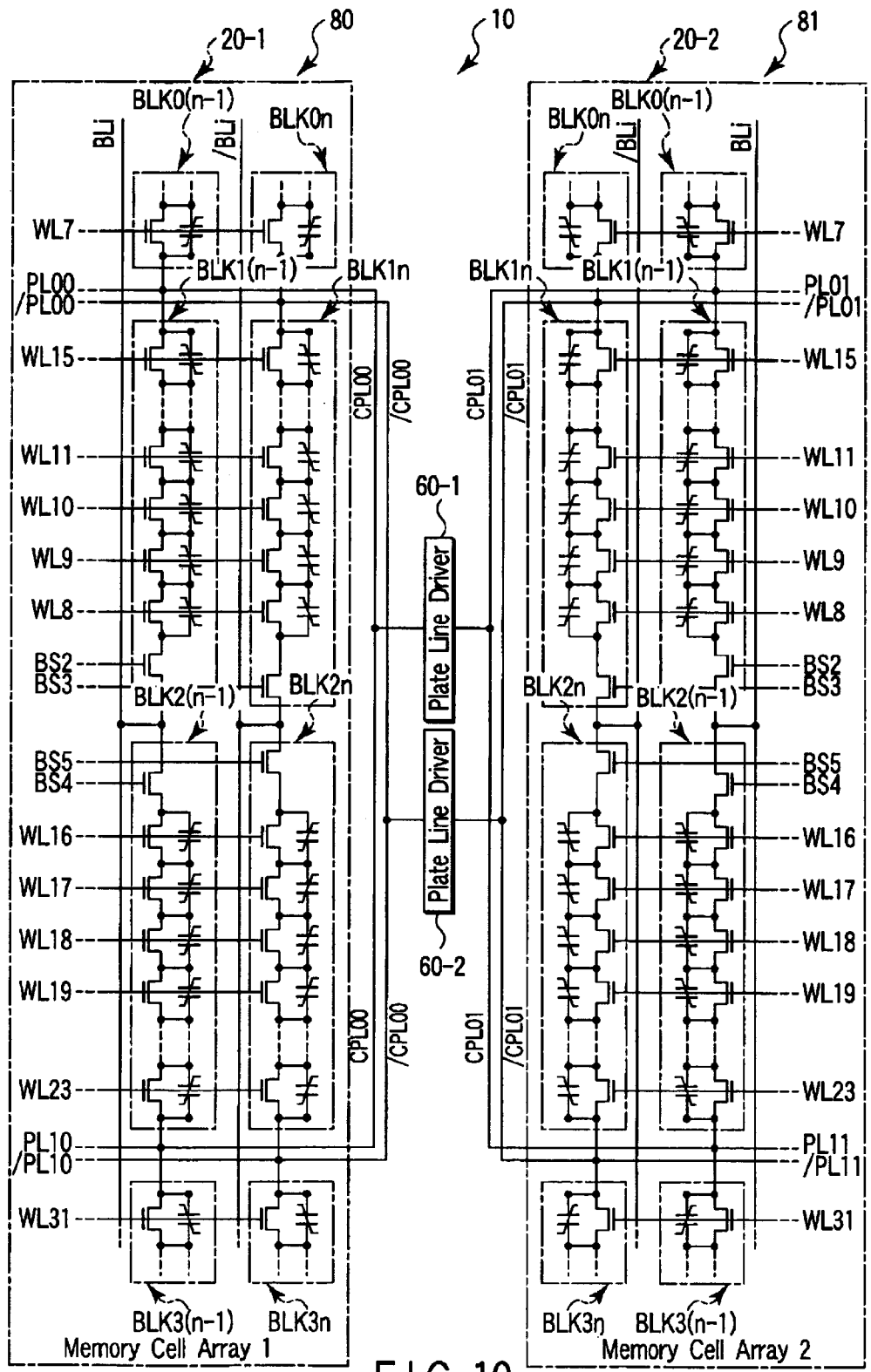
F I G. 10

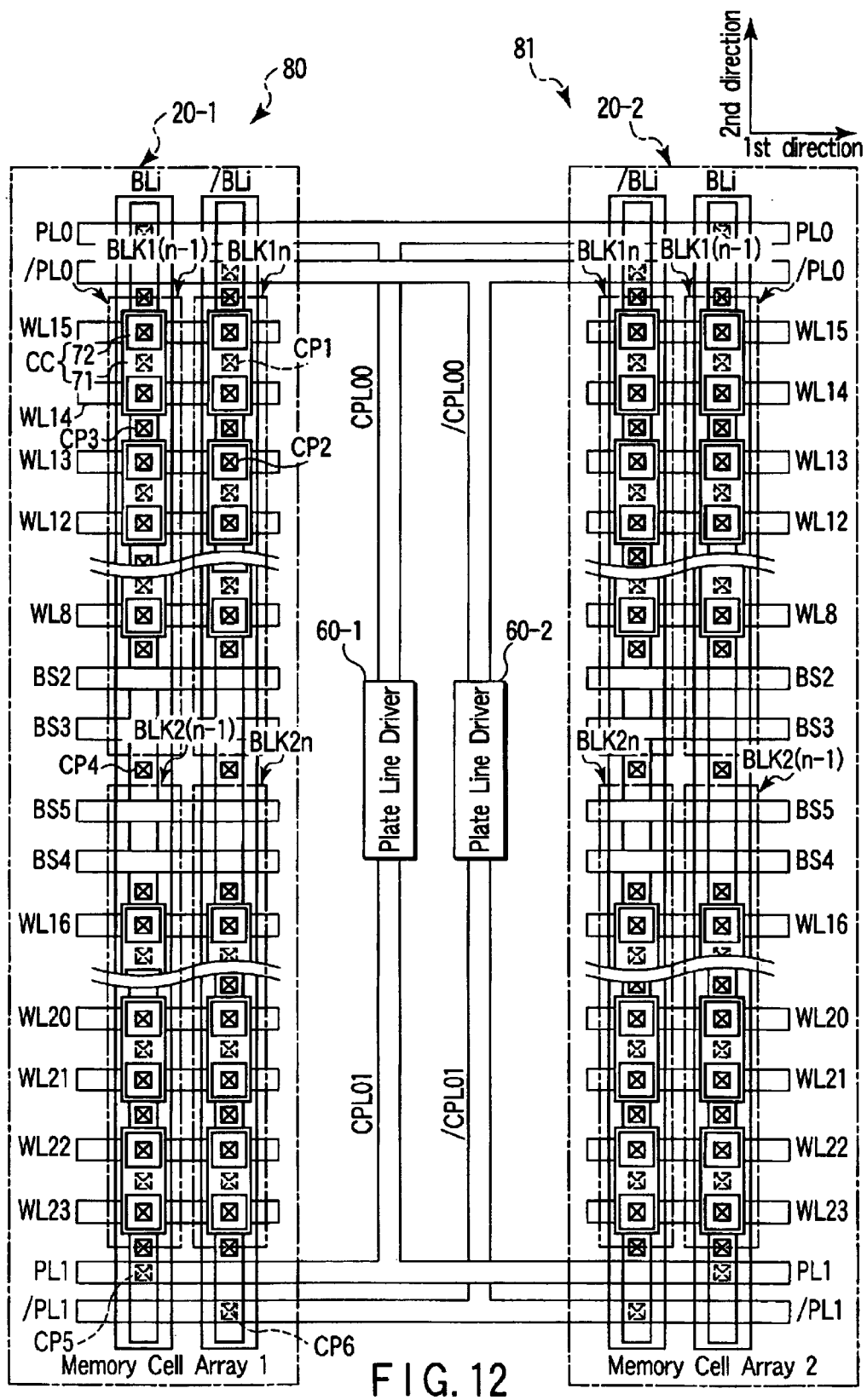
F I G. 12

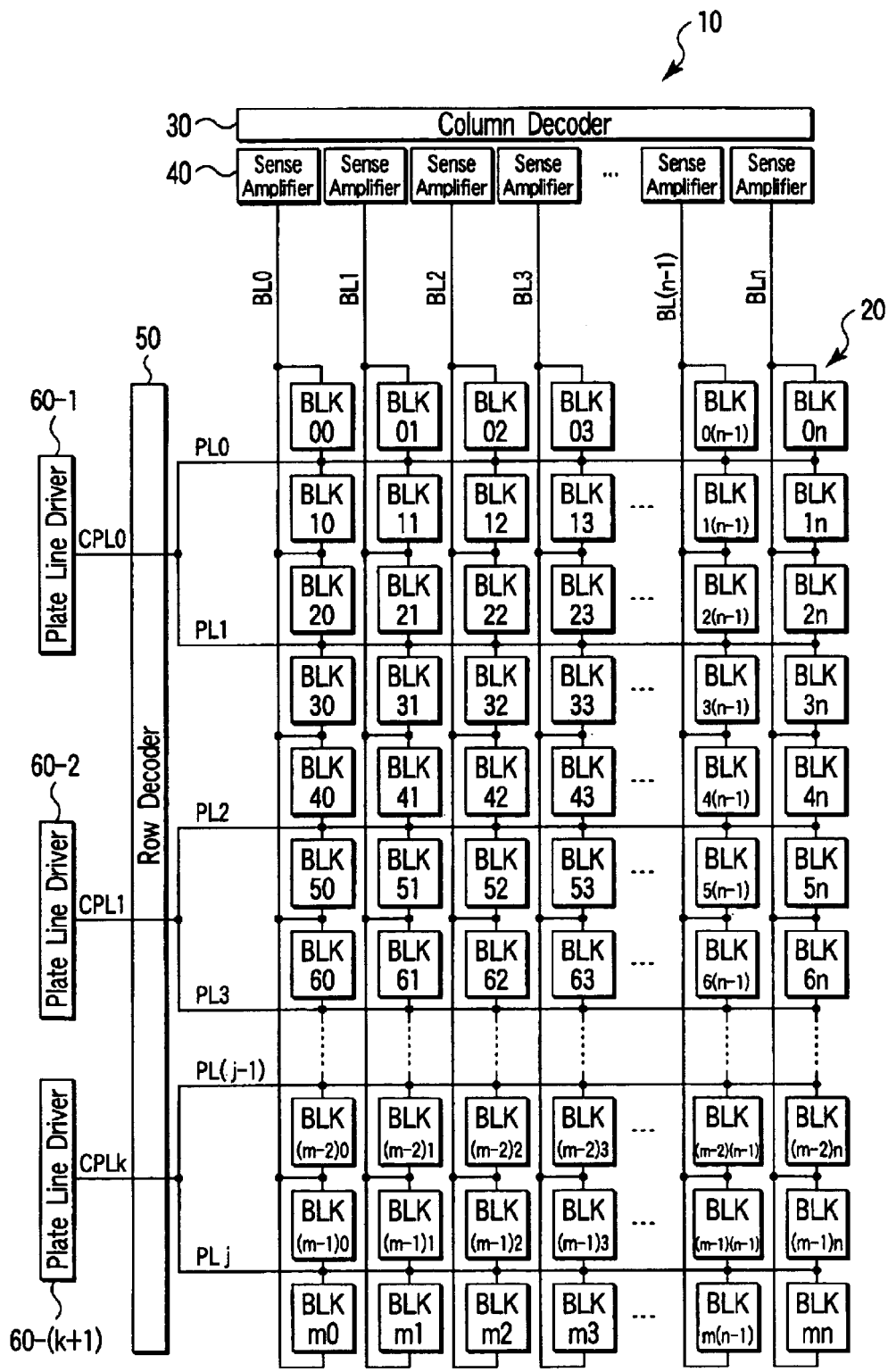
F I G. 15

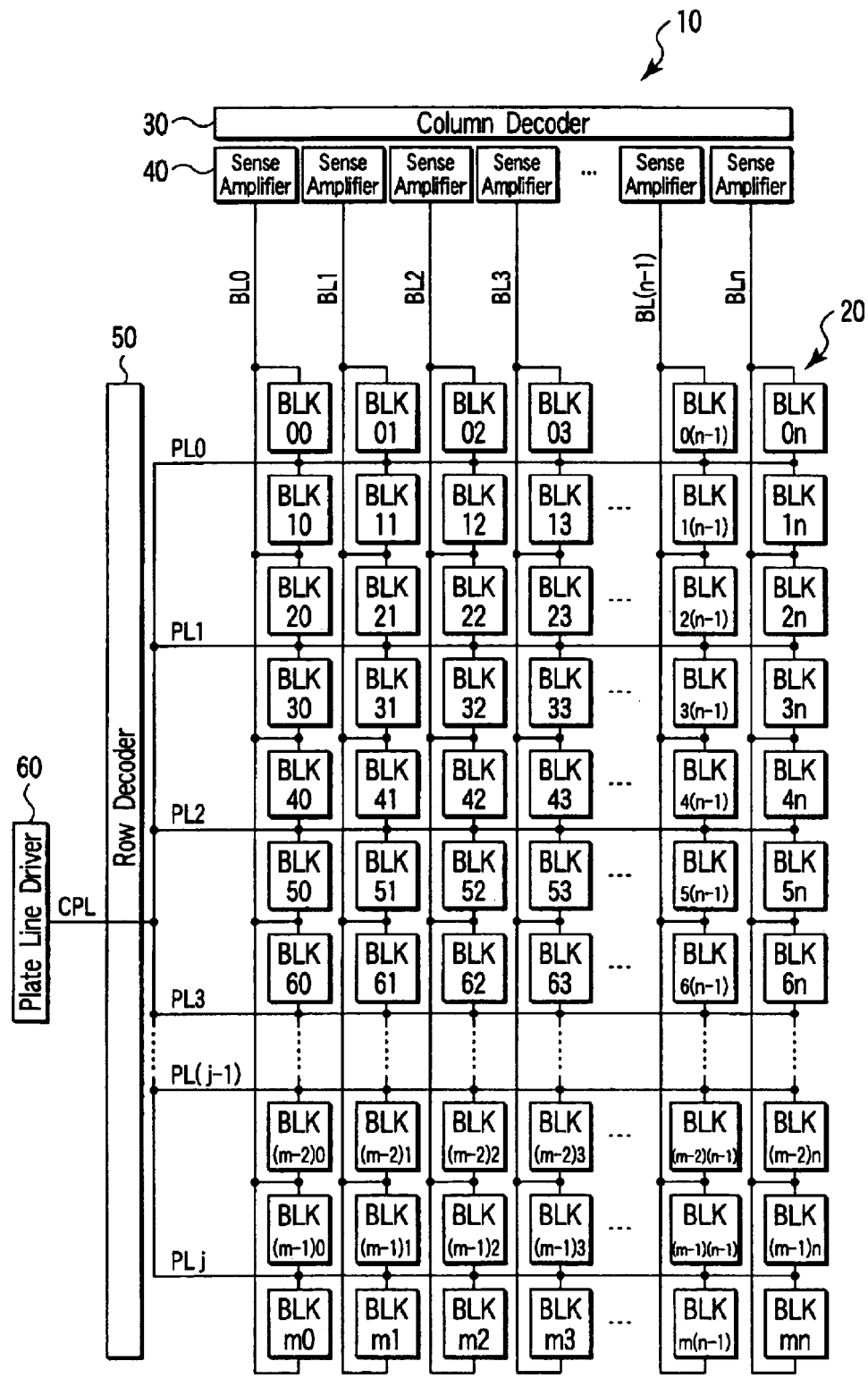
F I G. 16

SEMICONDUCTOR INTEGRATED CIRCUIT DEVICE HAVING FERROELECTRIC CAPACITOR

CROSS-REFERENCE TO RELATED APPLICATIONS

This application is based upon and claims the benefit of priority from the prior Japanese Patent Application No. 2003-198953, filed Jul. 18, 2003, the entire contents of which are incorporated herein by reference.

BACKGROUND OF THE INVENTION

1. Field of the Invention

The present invention relates to a semiconductor integrated circuit device such as a ferroelectric memory using a ferroelectric capacitor, for instance.

2. Description of the Related Art

Recently, a ferroelectric memory including a ferroelectric capacitor whose capacitor insulation film is made of ferroelectric materials has received attention.

Using a hysteresis characteristic that is one of characteristics of a ferroelectric, the ferroelectric memory stores two data items in a nonvolatile manner according to the level of two different residual polarizations. For example, a memory which consists of series connected memory cells each having a transistor having a source terminal and a drain terminal and a ferroelectric capacitor inbetween the two terminals, hereafter named "Series connected TC unit type ferroelectric RAM" is known. Such a ferroelectric memory is disclosed in, for example, D. takashima et al., "High-density Chain Ferroelectric Random Memory (CFRAM)," Processing VLSI Symposium, 1997, pp. 83-84.

The prior art ferroelectric memory is however likely to increase in chip size. The ferroelectric memory holds data according to the level of residual polarization, unlike a DRAM (dynamic random access memory). It is thus necessary to drive a plate line when data is read out. In the prior art ferroelectric memory, however, a plate line driver occupies a large area in a semiconductor chip and thus the chip is difficult to decrease in size.

BRIEF SUMMARY OF THE INVENTION

A semiconductor integrated circuit device according to an aspect of the present invention includes:

unit cells each including a cell transistor and a ferroelectric capacitor connected between a source and a drain of the cell transistor;

memory cell blocks each including the unit cells connected in series between a first terminal and a second terminal and a block select transistor connected between the second terminal and a third terminal;

bit lines each of which connects commonly the third terminals of the memory cell blocks, the bit lines extending alone a first direction;

sense amplifiers provided in correspondence to the bit lines and configured to amplify data supplied to the bit lines;

word lines each of which connects commonly gates of cell transistors in the memory cell blocks;

block select signal lines each of which connects commonly gates of block select transistors in the memory cell blocks;

plate lines each of which connects commonly the first terminals of the memory cell blocks, the plate lines extending along a second direction perpendicular to the first direction, and the memory cell blocks connected to one of the plate lines being connected to different ones of the sense amplifiers; and a plate line driver to which a plurality of the plate lines are connected and which applies a potential to the plate lines.

BRIEF DESCRIPTION OF THE SEVERAL VIEWS OF THE DRAWING

FIG. 1 is a block diagram of a ferroelectric memory according to a first embodiment of the present invention;

FIG. 4 is a timing chart of different signals generated when data is read out of the ferroelectric memory according to the first embodiment of the present invention;

FIG. 7 is a circuit diagram of memory cell arrays of the ferroelectric memory according to the second embodiment of the present invention;

FIG. 10 is a circuit diagram of memory cell arrays of the ferroelectric memory according to the third embodiment of the present invention;

FIG. 12 is a plan view of memory cell arrays of a ferroelectric memory according to a first modification to the third embodiment of the present invention;

FIG. 15 is a block diagram of a ferroelectric memory according to a second modification to the first to third embodiments;

FIG. 16 is a block diagram of a ferroelectric memory according to a third modification to the first to third embodiments.

DETAILED DESCRIPTION OF THE INVENTION

Figure 2:
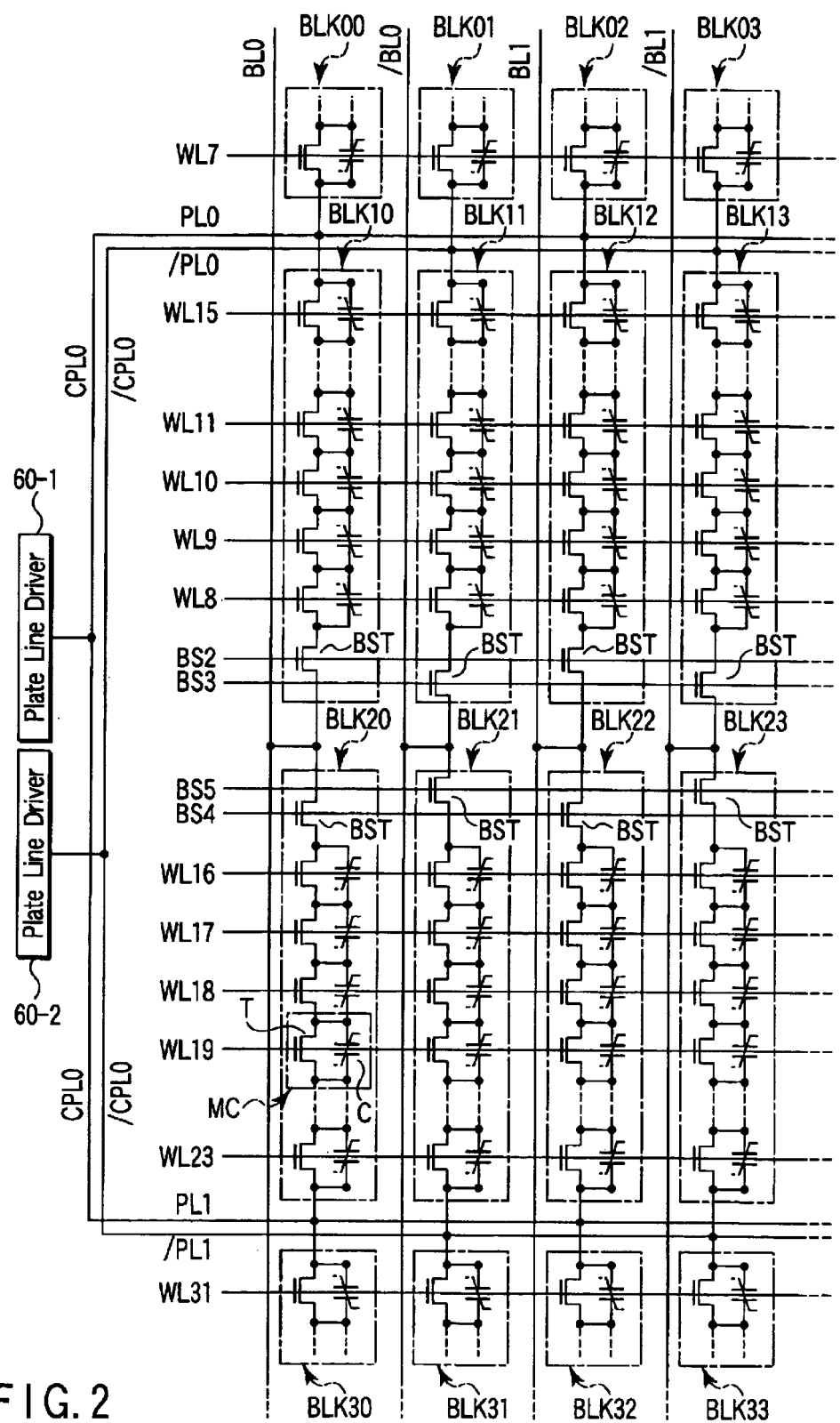
FIG. 2 is a circuit diagram of a memory cell array of the ferroelectric memory according to the first embodiment of the present invention.

A semiconductor integrated circuit device according to a first embodiment of the present invention will now be described with reference to FIG. 1. As an example of the first embodiment, a Series connected TC unit type ferroelectric RAM is taken which includes consists of series connected memory cells each having a transistor (T) having a source terminal and a drain terminal and a ferroelectric capacitor inbetween the two terminals, hereafter named "Series connected TC unit type ferroelectric RAM". FIG. 1 is a block diagram showing a major part of a Series connected TC unit type ferroelectric RAM.

Referring to FIG. 1, a ferroelectric memory 10 comprises a memory cell array 20, a column decoder 30, a sense amplifier 40, a row decoder 50 and plate line drivers 60-1 and 60-2.

The memory cell array 20 includes (m+1)×(n+1) (m and n are natural numbers) memory cell blocks BLK00 to BLKmn that are arranged in matrix. FIG. 1 shows only 4×4 memory cell blocks BLK00 to BLK33. The first embodiment will now be described paying attention to the memory cell blocks BLK00 to BLK33. The number of memory cell blocks is not limited in particular. Each of the memory cell blocks BLK00 to BLK33 includes a plurality of memory cells. The structure of each of the memory cell blocks BLK00 to BLK33 will be described in detail later. Adjacent two-column memory cell blocks hold data complementary to each other. More specifically, the memory cell blocks BLK00 to BLK30 and the memory cell blocks BLK01 to BLK31 hold data complementary to each other, while the memory cell blocks BLK02 to BLK32 and the memory cell blocks BLK03 to BLK33 hold data complementary to each other.

Memory cell blocks in one column are connected at one end to the same bit line. More specifically, the memory cell blocks BLK00 to BLK30 are connected at one end to a bit line BL0 and the memory cell blocks BLK01 to BLK31 are connected at one end to a bit line /BL0. Furthermore, the memory cell blocks BLK02 to BLK32 are connected at one end to a bit line BL1 and the memory cell blocks BLK03 to BLK33 are connected at one end to a bit line /BL1.

The other ends of adjacent two-row memory cell blocks that are connected to the bit line BL are connected to the same plate line, and so are the other ends of adjacent two-row memory cell blocks that are connected to the bit line /BL. More specifically, of the memory cell blocks BLK00 to BLK03 and BLK10 to BLK13, the other terminals of the memory cell blocks, which are connected to the bit lines BL0 and BL1, are connected to a plate line PL0. Of the memory cell blocks BLK10 to BLK13 and BLK20 to BLK23, the other terminals of the memory cell blocks, which are connected to the bit lines /BL0 and /BL1, are connected to a plate line /PL0. Of the memory cell blocks BLK20 to BLK23 and BLK30 to BLK33, the other terminals of the memory cell blocks, which are connected to the bit lines BL0 and BL1, are connected to a plate line PL1. Of the memory cell blocks BLK20 to BLK23 and BLK30 to BLK33, the other terminals of the memory cell blocks, which are connected to the bit lines /BL0 and /BL1, are connected to a plate line /PL1. The plate lines PL0 and PL1 are connected to a common plate line CPL0 and the plate lines /PL0 and /PL1 are connected to a common plate line /CPL0.

The memory cell blocks in the same row share the use of block select signal lines and word lines. More specifically, the memory cell blocks BLK00 to BLK03 in the same row are connected in common to block select signal lines BS0 and BS1 and word lines WL0 to WL7. The memory cell blocks BLK10 to BLK13 in the same row are connected to block select signal lines BS2 and BS3 and word lines WL8 to WL15. The memory cell blocks BLK20 to BLK23 in the same row are connected to block select signal lines BS4 and BS5 and word lines WL16 to WL23. The memory cell blocks BLK30 to BLK33 in the same row are connected to block select signal lines BS6 and BS7 and word lines WL24 to WL31.

The column decoder 30 decodes an externally supplied column address signal into a column address decode signal and then selects any of the bit lines.

The row decoder 50 decodes an externally supplied row address signal into a row address decode signal and then selects any of the block select signal lines and any of the word lines.

The sense amplifier 40 amplifies data that is read out of memory cells selected by the column decoder 30 and row decoder 30 and 50.

The plate line drivers 60-1 and 60-2 apply plate potentials to the common plate lines CPL0 and /CPL0, respectively.

The structure of each of the memory cell blocks BLK00 to BLKmn will now be described in detail with reference to FIG. 2. FIG. 2 is a circuit diagram of part of the memory cell array 20 and, more specifically, shows memory cell blocks BLK10 to BLK13 and BLK20 to BLK23.

Referring to FIG. 2, each of the memory cell blocks BLK00 to BLKmn includes a plurality of series connected memory cells MC and a block select transistor BST. In FIG. 2, one memory cell block includes eight memory cells MC; however, the number is not limited to eight but can be sixteen or thirty-two. Each of the memory cells MC has a MOS (cell) transistor T and a ferroelectric capacitor C. The ferroelectric capacitor C is a capacitor element whose capacitor insulation film is made of ferroelectric materials. For example, lead zirconate titanate (Pb—Zr—Ti—O: PZT) and strontium-bismuth titanate (Sr—Bi—Ta—O: SBT) can be used as the ferroelectric materials. One electrode of the ferroelectric capacitor C is connected to the source of the cell transistor T, and the other electrode is connected to the drain of the cell transistor T. The source of the cell transistor T is connected to the drain of the cell transistor T of an adjacent memory cell MC, while the drain thereof is connected to the source of the cell transistor T of another adjacent memory cell MC. The gate electrodes of cell transistors T of memory cells MC in each row are connected to their corresponding one of word lines WL0 to WL31. The source of the cell transistor located at one end of each column of eight memory cells connected in series as described above is connected to the plate line PL or /PL. The drain of the cell transistor located at the other end of the column of eight memory cells is connected to the bit line BL or /BL via block select transistors BST. In other words, the sources of the block select transistors BST are connected to the drain of the cell transistor that is located at the other end of the column of eight memory cells, and the drains thereof are connected to the bit line BL or /BL.

The gates of the block select transistors BST are connected to the block select signal lines BS. The gates of block select transistors BST in memory cell blocks arranged in the same row and connected to the same plate line are connected to the same block select signal line BS. More specifically, the block select transistors BST in the memory cell blocks BLK00 and BLK02 are connected to the block select signal line BS0. The block select transistors BST in the memory cell blocks BLK01 and BLK03 are connected to the block select signal line BS1. The block select transistors BST in the memory cell blocks BLK10 and BLK12 are connected to the block select signal line BS2. The block select transistors BST in the memory cell blocks BLK11 and BLK13 are connected to the block select signal line BS3. The block select transistors BST in the memory cell blocks BLK20 and BLK22 are connected to the block select signal line BS4. The block select transistors BST in the memory cell blocks BLK21 and BLK23 are connected to the block select signal line BS5. The block select transistors BST in the memory cell blocks BLK30 and BLK32 are connected to the block select signal line BS6. The block select transistors BST in the memory cell blocks BLK31 and BLK33 are connected to the block select signal line BS7.

Figure 3:
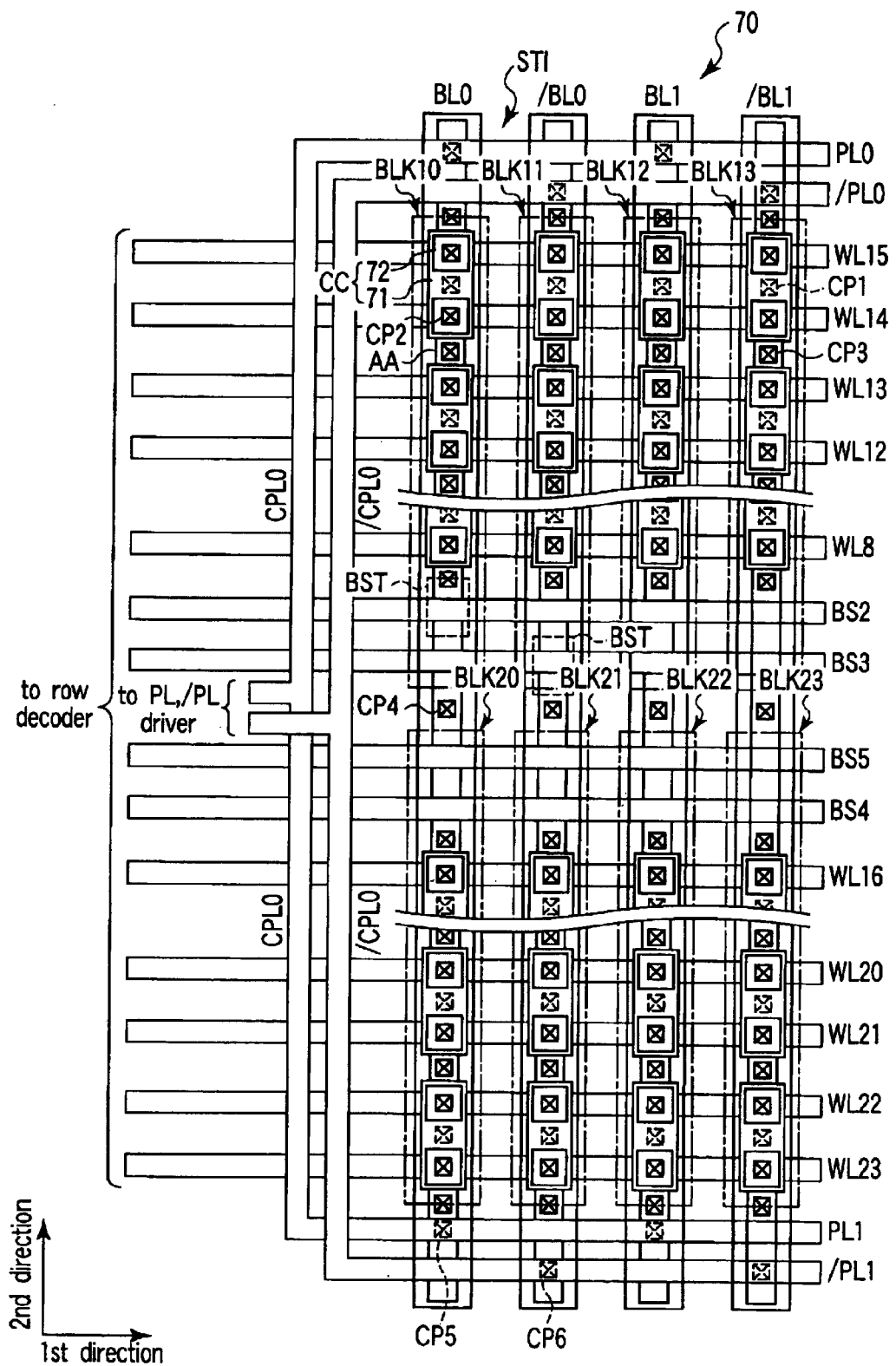
FIG. 3 is a plan view of the memory cell array of the ferroelectric memory according to the first embodiment of the present invention.

A plane pattern of the memory cell array 20 will now be described with reference to FIG. 3. FIG. 3 is a plan view of part of the memory cell array 20 that includes memory cell blocks BLK10 to BLK13 and BLK20 to BLK23. FIG. 3 shows a Series connected TC unit type ferroelectric RAM adopting a COP (capacitor on plug) structure.

As shown in FIG. 3, a silicon substrate 70 includes a plurality of element regions AA that are arranged in a first direction. In each of the element regions AA, memory cells MC and block select transistors BST are formed. Each element region AA is shaped like a stripe extending along a second direction perpendicular to the first direction. Element isolation regions STI are formed except where the element regions AA are formed. Word lines WL and block select signal lines BS are formed on the silicon substrate 70 so as to extend over the element regions AA. These word lines and block select signal lines are each shaped like a stripe extending along the first direction. Cell transistors (not shown) are formed where the word lines WL and element regions AA cross each other. Moreover, cell capacitors CC are formed almost immediately above the cell transistors. The cell capacitors CC each include an lower-capacitor electrode 71 and an upper-capacitor electrode 72 that is formed on the electrode 71 with a ferroelectric film interposed therebetween. Two cell capacitors CC that are adjacent in the longitudinal direction of the element regions AA share the use of one lower-capacitor electrode 71 and each extend over their respective cell transistors. The lower-capacitor electrodes 71 are arranged in a grid pattern within the plane of the silicon substrate 70 and each electrically connected to one of impurity diffusion layers of two cell transistors through a contact plug CP1. The upper-capacitor electrodes 72 are separately formed almost immediately above their respective cell transistors. The upper-capacitor electrodes 72 are each electrically connected to the other impurity diffusion layer through contact plugs CP2 and CP3. In the case of FIG. 3, the lower-capacitor electrodes 71 are arranged in a grid pattern. However, they can be arranged in a staggered manner.

The block select transistors BST are formed where the element regions AA and the block select signal lines BS cross each other. As described above, the select transistors BST are connected in series between bit lines BL, /BL and adjacent memory cells. In other words, the drain region of a select transistor is connected to the bit lines BL and /BL via a contact plug CP4 formed on the drain region. The source region thereof is connected to the drain region of an adjacent memory cell and the upper-capacitor electrodes 72 through the contact plugs CP2 and CP3. As illustrated in FIG. 3, two block select signal lines pass through each of the memory cell blocks; however, it is only one that substantially functions as a block select signal line. More specifically, in FIG. 3, two block select signal lines BS2 and BS3 pass through the memory cell blocks BLK10 and BLK12 and it is only the block select signal line BS2 that substantially functions. The block select signal line BS3 simply passes over the element region AA. The bit lines BL and /BL are each shaped like a stripe extending along the second direction and connected to the drain regions of block select transistors BST in the memory cell blocks in the same column through the contact plugs CP4.

A pair of plate lines PL and /PL is formed on the silicon substrate 70 and shaped like a stripe extending along the first direction. The plate lines PL and /PL extend over the source regions of cell transistors that are located farthest from the block select transistors BST in memory cell blocks in the same row. The source regions of the cell transistors are connected to the plate lines PL and /PL through contact plugs CP5 and CP6 formed on the source regions, respectively. More specifically, the source regions of cell transistors that are located farthest from the block select transistors BST in the memory cell blocks BLK10 and BLK12 are connected to the plate line PL0 through the contact plug CP5. The source regions of cell transistors that are located farthest from the block select transistors BST in the memory cell blocks BLK11 and BLK13 are connected to the plate line /PL0 through the contact plug CP6. The source regions of cell transistors that are located farthest from the block select transistors BST in the memory cell blocks BLK20 and BLK22 are connected to the plate line PL1 through the contact plug CP5. The source regions of cell transistors that are located farthest from the block select transistors BST in the memory cell blocks BLK21 and BLK23 are connected to the plate line /PL1 through the contact plug CP6.

The plate lines PL0 and PL1 are connected to each other by a common plate line CPL0. The common plate line CPL0 is shaped like a stripe extending along the second direction and formed at the end of the memory cell array. The plate lines PL0 and PL1 are shaped like a stripe extending along the first direction and one end of each of them is connected to the common plate line CPL0. The common plate line CPL0 is connected to a plate line driver 60-1 through a region that is formed in the first direction. Similarly, the plate lines /PL0 and /PL1 are connected to each other by a common plate line /CPL0. The common plate line /CPL0 is shaped like a stripe extending along the second direction and formed at the end of the memory cell array. The plate lines /PL0 and /PL1 are shaped like a stripe extending along the first direction and one end of each of them is connected to the common plate line /CPL0. The common plate line /CPL0 is connected to a plate line driver 60-2.

A method of reading data out of the above-described ferroelectric memory will now be described with reference to FIGS. 1, 2 and 4. FIG. 4 is a timing chart of different signals generated when data is read out of the Series connected TC unit type ferroelectric RAM. Assume here that data is read out of a memory cell MC connected to a word line WL19 in the memory cell block BLK20.

First, the bit lines BL0 and /BL0 are precharged in standby state (to time t1). In other words, a precharge circuit (not shown) precharges the potentials of the bit lines BL0 and /BL0 to Vblp. The precharge level Vblp is for example (Vaa+Vss)/2. The potential Vaa is for example an internal power supply potential and the potential Vss is a ground potential. The precharge level Vblp has only to be set between the potentials Vaa and Vss or at potential Vss. Simultaneously, the plate line drivers 60-1 and 60-2 precharge the plate lines PL1 and /PL1 to potential Vss. The plate lines PL1 and /PL1 are connected to the plate lines PL0 and /PL0 through the common plate lines CPL0 and /CPL0, respectively. Consequently, the plate lines PL0 and /PL0 connected to the non-select memory cell blocks are also precharged to potential Vss.

In the standby state, the row decoder 50 applies a low-level potential to the block select signal lines BS4 and BS5. Thus, the block select transistor BST in the memory cell block BLK20 turns off. The row decoder 50 applies a high-level potential to all the word lines WL16 to WL23 in the memory cell block BLK20 and the cell transistor T turns on. Needless to say, the row decoder 50 applies a low-level potential to all block select signal lines except for the block select signal lines BS4 and BS5 connected to the select memory cell blocks BLK20. The row decoder 50 applies the high-level potential to all word lines except for the word lines WL16 to WL23.

In order to read data from the memory cell in the above state, the ferroelectric memory shifts to an active state from the standby state. In other words, the precharge circuit is inactivated at time t1. Thus, the bit lines BL0 and /BL0 are floated at the precharge level. Then, a bit line driving circuit (not shown) decreases the potential of the bit line BL0 selected by the column decoder 30 by reference voltage Vdr from the precharge level.

When the potential of the bit line BL0 lowers to (Vblp−Vdr) (time t2), the bit line driving circuit is electrically disconnected from the bit line BL0.

At time t3, data is read out of the memory cell. In other words, the row decoder 50 selects the word line WL19. Thus, the cell transistor T connected to the word line WL19 turns off. The row decoder 50 sets the block select signals BS4 and BS5 at a high level and the block select transistor BST in the memory cell block BLK20 turns on. Therefore, the bit line BL0 at the potential (Vblp−Vdr) is electrically connected to the selected memory cell. The bit line /BL at the precharge potential is electrically connected to the memory cell connected to the word line WL19 in the memory cell block BLK21. Furthermore, the plate line drivers 60-1 and 60-2 apply a potential VINT to the plate lines PL1 and /PL1, with the result that the potentials of the bit lines BL0 and /BL0 vary in accordance with the data held in the selected memory cell. In other words, when data "0" is held in the memory cell, the potential of the bit line BL0 becomes −ΔV lower than the precharge level of the bit line /BL0. Conversely, when data "1" is held, the potential of the bit line BL0 becomes +ΔV higher than the precharge level of the bit line /BL0.

At time t4, the sense amplifier 40 is activated. The activated sense amplifier 40 senses a potential difference +ΔV or −ΔV appearing between the bit lines BL0 and /BL0 and amplifies the potential difference. Thus, when data "0" is held in the memory cell, the potential of the bit line BL0 lowers to the ground potential Vss. On the other hand, the potential of the bit line /BL0 rises to the internal power supply potential Vaa. Conversely, when data "1" is held in the memory cell, the potential of the bit line BL0 rises to the internal power supply potential Vaa and the potential of the bit line /BL0 lowers to the ground potential Vss.

Data is thus read out of the memory cell in the manner described above. After data is read out, it is restored and the ferroelectric memory returns to the standby state.

According to the above ferroelectric memory, the area of the plate line drivers occupied in the semiconductor chip can be reduced and so can be minimized the size of the chip. This advantage will be described in detail below.

In the prior art Series connected TC unit type ferroelectric RAM, a plate line driver is provided for each plate line. In other words, one plate line driver is required for every two-row memory cell blocks.

In the Series connected TC unit type ferroelectric RAM according to the first embodiment of the present invention, two plate lines are connected to a common plate line and a plate line driver is provided for each common plate line. In other words, one plate line driver is shared by two plate lines, or one plate line driver has only to be provided for every four-row memory cell blocks. It can also be said that four-row memory cell blocks are connected to each other by a single plate line. The number of plate line drivers can thus be reduced to half that in the prior art ferroelectric memory; consequently, the chip size can be reduced.

If one plate line driver is shared by two plate lines as in the first embodiment, the plate lines naturally increase in wiring capacity and wiring resistance and, in other words, the plate line driver increases in load. It is thus necessary to improve the driving performance of the plate lines in order to drive the plate lines without lowering their driving speed, and the circuit area of the plate line driver increases accordingly. In general, however, the capacity of the ferroelectric capacitor is more dominant over the load of the plate line driver than the wiring resistance and wiring capacity. This is because the permittivity of the capacitor insulation film of the ferroelectric capacitor is very high and thus the capacity of the ferroelectric capacitor is much larger than the wiring capacity. Most load on the plate line driver therefore depends upon the number of selected cell capacitors connected to the plate lines.

With the above arrangement according to the first embodiment, the following relationship is established between two plate lines that share the use of a plate line driver in read mode: When a memory cell block connected to one of the plate lines is selected, a memory cell block connected to the other plate line is always non-selected. For example, in FIG. 1, the plate lines PL0 and PL1 share the use of the plate line driver 60-1. Assume that the memory cell block BLK20 connected to the plate line PL1 is selected in read mode. On this assumption, the memory cell blocks BLK00 to BLK03 and BLK10 to BLK13, which are connected to the plate line PL0, are always non-selected. All of the word lines in the non-selected memory cell blocks are set at a high level. In other words, all of the word lines WL0 to WL15 are set at a high level (needless to say, the word lines WL24 to WL31 are non-selected). The fact that the word lines are set at a high level means that the cell capacitors are short-circuited by the cell transistors. Therefore, the cell capacitors of the non-selected memory cell blocks does not contribute to the parasitic capacitance of the plate line. In the above example, it is only the capacity of the cell capacitors of selected memory cells connected to the same word line in the same row as that of the selected memory cell block BLK20. The capacity of the cell capacitors in the memory cell blocks BLK00 to BLK03 and BLK10 to BLK13 does not contribute to the parasitic capacitor of the plate line. Even though two plate lines share the use of one plate line driver, the number of selected cell capacitors does not change from that in the prior art. In other words, the number of selected cell capacitors, which is a big factor in the load of the plate line drivers, is the same as that in the prior art. The load of the plate line drivers is caused only by the increase in wiring length due to a common connection of two plate lines. This load is only slightly increased (the total load is not higher than twice as high as that in the prior art). Therefore, the area of the plate line drivers occupied in the chip can greatly be reduced with a minimal increase in the load of the plate line drivers, with the result that the chip can be decreased in size.

Figure 5:
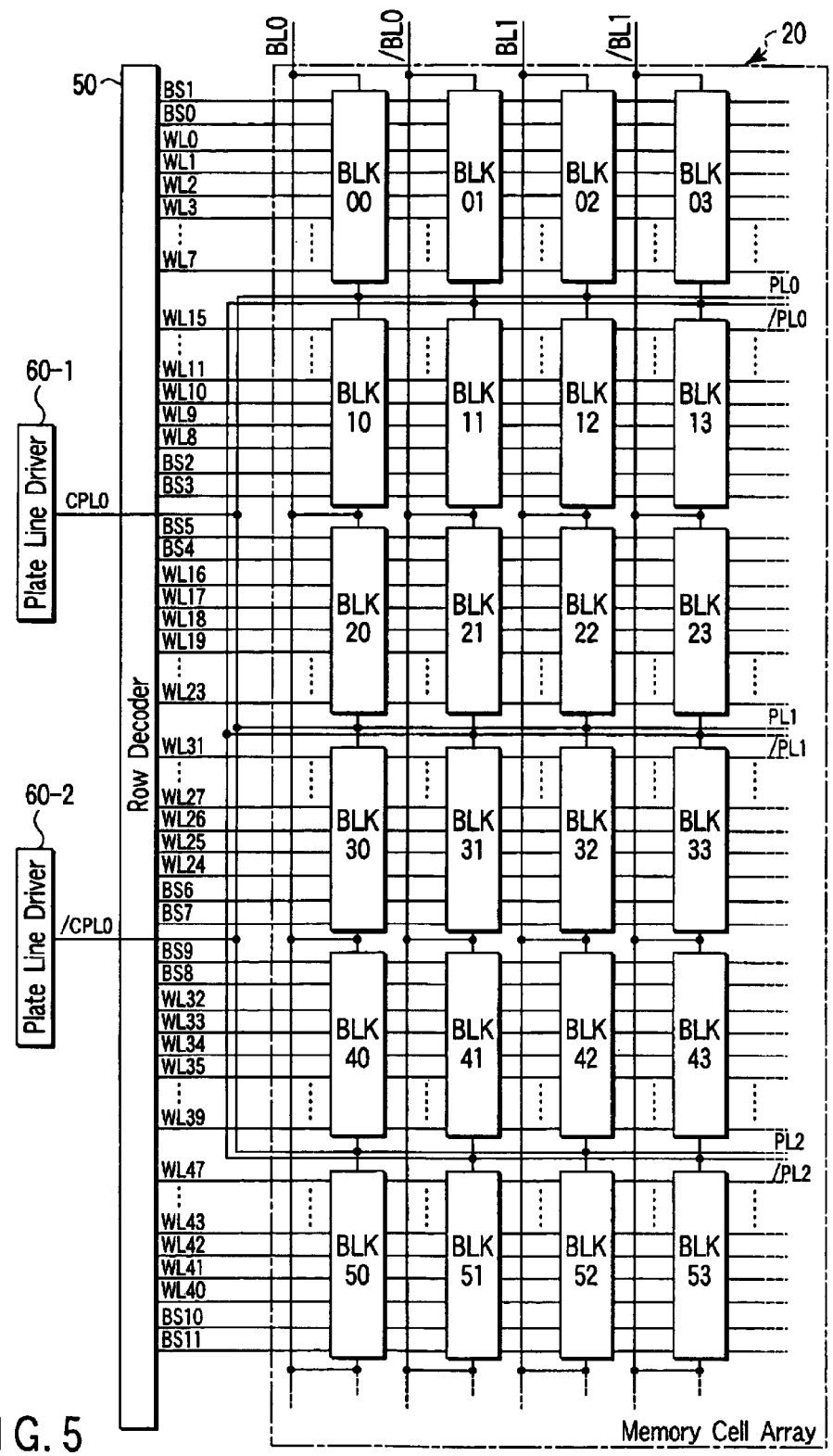
FIG. 5 is a block diagram of a ferroelectric memory according to a modification to the first embodiment of the present invention.

FIG. 5 is a block diagram showing a Series connected TC unit type ferroelectric RAM according to a modification to the first embodiment of the present invention. In the first embodiment described above, two plate lines share the use of one plate line driver. However, the number of plate lines need not be always two but can be three or more.

Referring to FIG. 5, three plate lines PL0 to PL2 are connected to a common plate line CPL0, and the common plate line CPL0 is connected to a plate line driver 60-1. Three plate lines /PL0 to /PL2 are connected to a common plate line /CPL0, and the common plate line /CPL0 is connected to a plate line driver 60-2. In other words, three plate lines share the one plate line driver, or six-row memory cell blocks are connected to each other by a single plate line. Even in this case, when memory cell blocks connected to a given plate line are selected in read mode, memory cell blocks connected to the other plate lines are always non-selected. No load of the plate line drivers therefore increases due to the capacity of cell capacitors. Consequently, the number of plate line drivers can be reduced to one-third that in the prior art with a minimal increase in the load of the plate line drivers.

Needless to say, the number of plate lines that share the use of one plate line is not limited to three but can be four or more.

Figure 6:
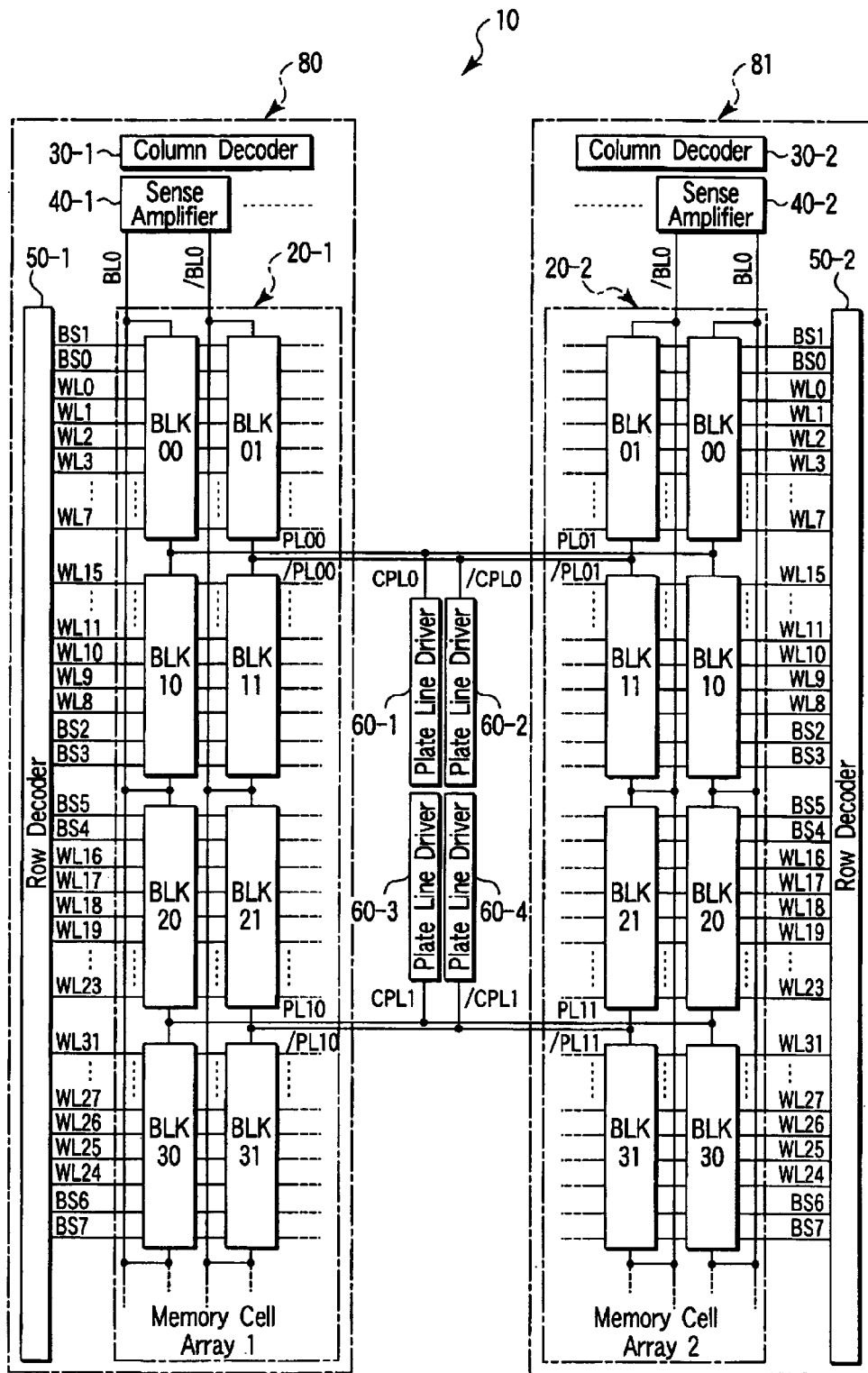
FIG. 6 is a block diagram of a ferroelectric memory according to a second embodiment of the present invention.

A semiconductor integrated circuit device according to a second embodiment of the present invention will now be described with reference to FIGS. 6 and 7. FIG. 6 is a block diagram of a Series connected TC unit type ferroelectric RAM according to the second embodiment, and FIG. 7 is a circuit diagram showing part of each memory cell array of the ferroelectric memory. In the second embodiment, a plate line driver is shared among a plurality of memory cell arrays.

As shown in FIGS. 6 and 7, a ferroelectric memory 10 comprises circuit blocks 80 and 81 and plate line drivers 60-1 to 60-4. When one of the circuit blocks 80 and 81 is selected and operated, the other is non-selected and not operated.

Each of the circuit blocks 80 and 81 has almost the same arrangement as that of the circuit block in the first embodiment. The circuit block 80 includes a memory cell array 20-1, a column decoder 30-1, a sense amplifier 40-1 and a row decoder 50-1. The circuit block 81 includes a memory cell array 20-2, a column decoder 30-2, a sense amplifier 40-2 and a row decoder 50-2.

Since the column decoders 30-1 and 30-2, sense amplifiers 40-1 and 40-2 and row decoders 50-1 and 50-2 operate in the same manner as those of the first embodiment, their descriptions are omitted. Furthermore, the memory cell arrays 20-1 and 20-2 have the same configuration as those of the first embodiment. Unlike in the first embodiment, the plate lines in each of the memory cell arrays are independent of each other. FIG. 7 is a circuit diagram of part of each of the memory cell arrays 20-1 and 20-2. As illustrated in FIGS. 6 and 7, two memory cell blocks that are adjacent to each other in the column direction share the use of a plate line. More specifically, in the circuit block 80, the memory cell blocks BLK00, BLK10, . . . , BLK0(n−1) and BLK1(n−1) are connected to a plate line PL00, and the memory cell blocks BLK20, BLK30, . . . , BLK2(n−1) and BLK3(n−1) are connected to a plate line PL10. Moreover, the memory cell blocks BLK01, BLK11, . . . , BLK0n and BLK0n are connected to a plate line /PL00, and the memory cell blocks BLK21, BLK31, . . . , BLK2n and BLK3n are connected to a plate line /PL10. In the circuit block 81, the memory cell blocks BLK00, BLK10, BLK0(n−1) and BLK1(n−1) are connected to a plate line PL01, and the memory cell blocks BLK20, BLK30, . . . , BLK2(n−1) and BLK3(n−1) are connected to a plate line PL11. Moreover, the memory cell blocks BLK01, BLK11, . . . , BLK0n and BLK1n are connected to a plate line /PL01, and the memory cell blocks BLK21, BLK31, . . . , BLK2n and BLK3n are connected to a plate line /PL11.

The plate lines PL00 and PL01 are connected to a common plate line CPL0, and the plate lines /PL00 and /PL01 are connected to a common plate line /CPL0. The plate lines PL10 and PL11 are connected to a common plate line CPL1, and the plate lines /PL10 and /PL11 are connected to a common plate line /CPL1. The common plate lines CPL0, /CPL0, CPL1 and /CPL1 are connected to plate line drivers 60-1, 60-2, 60-3 and 60-4, respectively. The plate line drivers 60-1 to 60-4 apply plate line potentials to the common plate lines CPL0, /CPL0, CPL1 and /CPL1, respectively.

Figure 8:
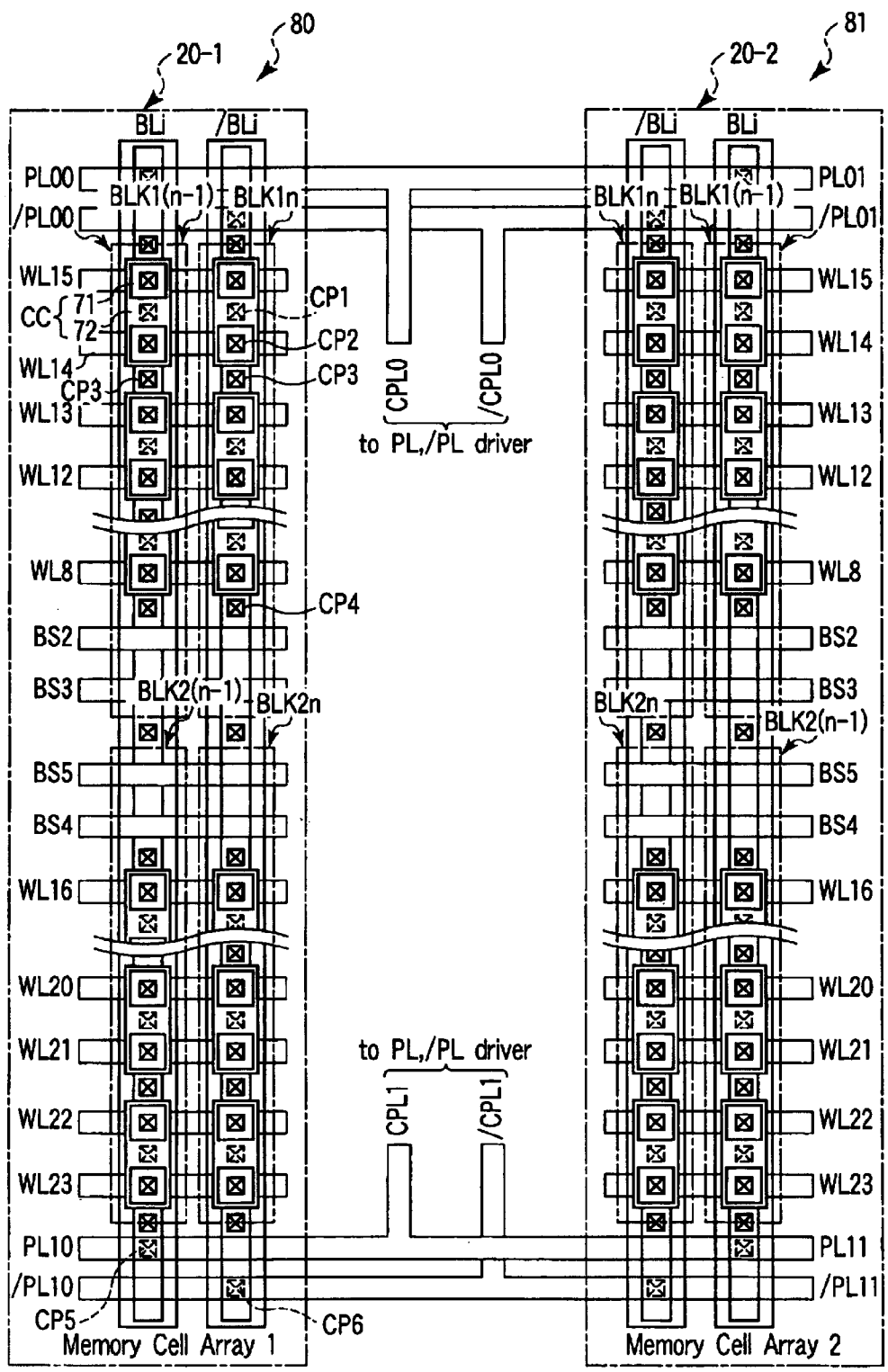
FIG. 8 is a plan view of the memory cell arrays of the ferroelectric memory according to the second embodiment of the present invention.

FIG. 8 is a plan view showing part of each of the memory cell arrays 20-1 and 20-2 and more particularly showing a plane pattern of a boundary section between the circuit blocks 80 and 81. Since the plane patterns of the memory cell arrays 20-1 and 20-2 in the circuit blocks 80 and 81 are the same as that of the first embodiment shown in FIG. 3, their descriptions are omitted.

The circuit blocks 80 and 81 are arranged adjacent to each other as illustrated in FIG. 8. The word lines WL of the circuit block 80 and those of the circuit block 81 are electrically separated from each other, as are the block select signal lines BS of the circuit block 80 and those of the circuit block 81. Each pair of plate lines PL00 and PL01, /PL00 and /PL01, PL10 and PL11, and /PL10 and /PL11 is formed of a metal wiring layer in the same row. The plate lines in the circuit block 80 are connected to their corresponding plate lines in the circuit block 81. In other words, each plate line is formed of a stripe-shaped metal wiring layer and connected to a metal wiring layer serving as a common plate line between the circuit blocks 80 and 81. The common plate line is shaped like a stripe along the bit lines and connected to its corresponding plate line driver.

The above Series connected TC unit type ferroelectric RAM according to the second embodiment performs the same read operation as that of the ferroelectric memory according to the first embodiment. However, as described above, two circuit blocks 80 and 81 (memory cell arrays 20-1 and 20-2) are not selected simultaneously.

Like the first embodiment, the second embodiment makes it possible to reduce the area of plate line drivers occupied in a semiconductor chip and thus decrease the size of the chip. This advantage will be described in detail below.

In the prior art Series connected TC unit type ferroelectric RAM, a plate line driver is provided for each plate line in each memory cell array. In other words, if there are two memory cell arrays, it is necessary to provide plate line drivers the number of which is twice as large as that of plate line drivers required for one memory cell array. If the prior art ferroelectric memory is applied to the circuit arrangement shown in FIG. 6, a plate line driver is required for each of plate lines PL00, /PL00, PL10, /PL10, PL01, /PL01, PL11 and /PL11, and the total number of plate line drivers is eight that is the same as the number of plate lines.

In the Series connected TC unit type ferroelectric RAM according to the second embodiment, plate lines are connected to a common plate line between two memory cell arrays, and a plate line driver is provided for each common plate line. In other words, one plate line driver is shared by two plate lines between two memory cell arrays, or one plate line driver has only to be provided for every two-row memory cell blocks included in each memory cell array. Furthermore, in other words, four-row memory cell blocks are connected to each other by a single plate line. The number of plate line drivers can thus be reduced to half that in the prior art ferroelectric memory; consequently, the chip size can be decreased.

If two plate lines share the use of one plate line driver as in the first embodiment, the plate lines increase in wiring capacity and wiring resistance, which cause the load of the plate line drivers. In the second embodiment, the load of the plate line drivers, which is due to the capacity of the cell capacitors, does not change as in the first embodiment. This is because two memory cell arrays that share the use of a plate line driver are not selected at the same time. More specifically, when a memory cell in one of the memory cell arrays is selected, all the memory cells in the other memory cell array are non-selected. Since the cell capacitors of the non-select memory cells are short-circuited by the cell transistors, their capacity does not contribute to the parasitic capacitance of the plate line. Therefore, an increase in the load of the plate line drivers, which is due to the sharing of a plate line driver by a plurality of plate lines, is simply caused by the wiring resistance and wiring capacitance only. Consequently, the area of the plate line drivers occupied in the chip can greatly be reduced with a minimal increase in the load of the plate line drivers and thus the chip can be decreased in size.

In the second embodiment, two memory cell arrays share the use of a plate line driver. However, the number of memory cell arrays sharing the use of a plate line driver is not limited to two but can be three or more.

Figure 9:
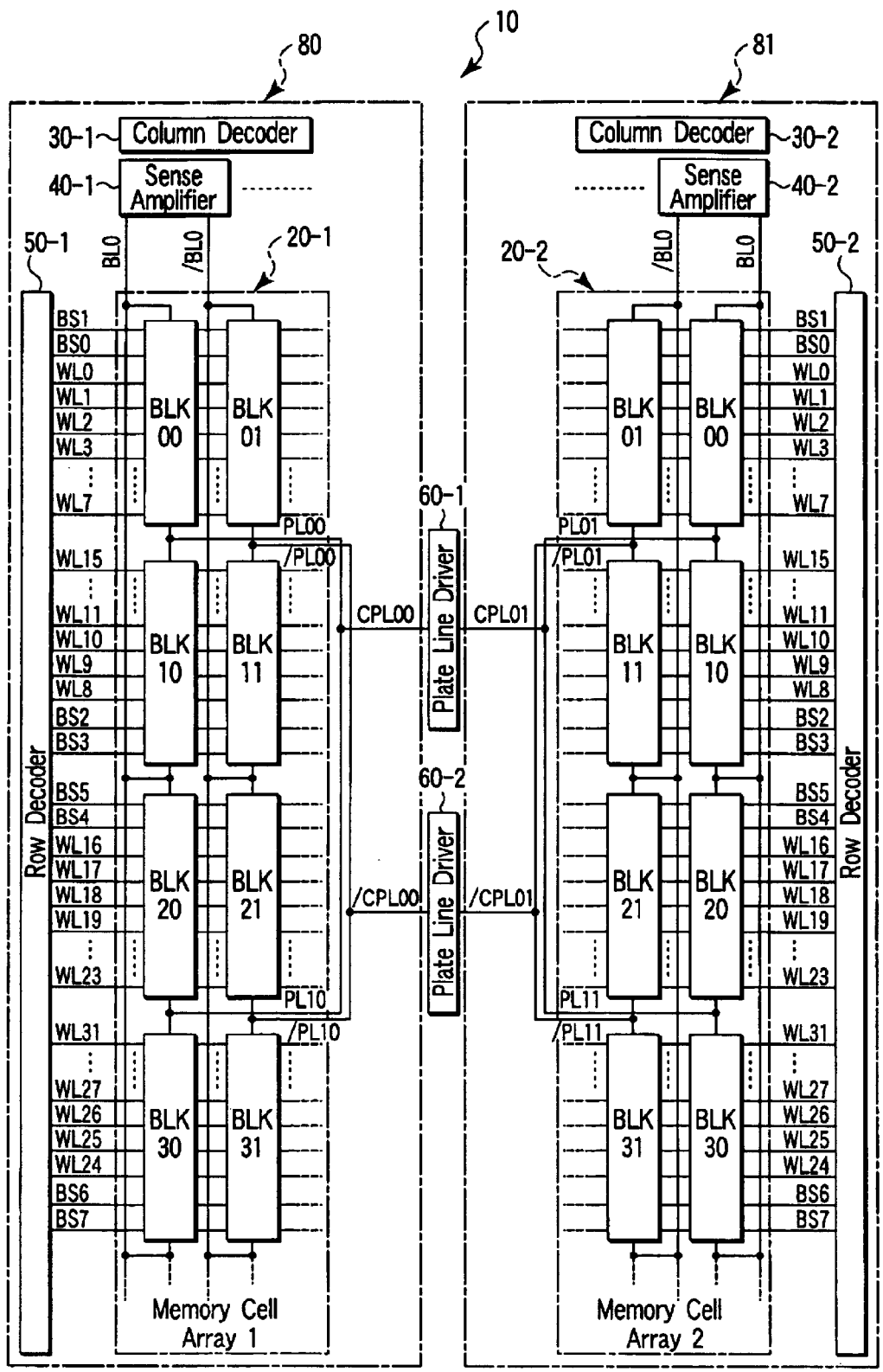
FIG. 9 is a block diagram of a ferroelectric memory according to a third embodiment of the present invention.

A semiconductor integrated circuit device according to a third embodiment of the present invention will now be described with reference to FIGS. 9 and 10. FIG. 9 is a block diagram of a Series connected TC unit type ferroelectric RAM according to the third embodiment, and FIG. 10 is a circuit diagram showing part of each memory cell array of the ferroelectric memory. The third embodiment is a combination of the first and second embodiments.

As shown in FIGS. 9 and 10, a ferroelectric memory 10 comprises circuit blocks 80 and 81 and plate line drivers 60-1 and 60-2. When one of the circuit blocks 80 and 81 is selected and operated, the other is non-selected and not operated.

Each of the circuit blocks 80 and 81 has almost the same arrangement as that of the circuit block in the second embodiment. The third embodiment differs from the second embodiment in that plate lines PL00 and PL10 in a memory cell array 20-1 are connected to a common plate line CPL00 and plate lines /PL00 and /PL10 therein are connected to a common plate line /CPL00 and also in that plate lines PL01 and PL11 in the memory cell array 20-2 are connected to a common plate line CPL01 and plate lines /PL01 and /PL11 therein are connected to a common plate line /CPL01. The common plate lines CPL00 and CPL01 are connected to a plate line driver 60-1 and the common plate lines /CPL00 and /CPL01 are connected to a plate line driver 60-2. The plate line driver 60-1 applies a plate potential to each of the common plate lines CPL00 and CPL01, and the plate line driver 60-2 applies a plate potential to each of the common plate lines /CPL00 and /CPL01.

Figure 11:
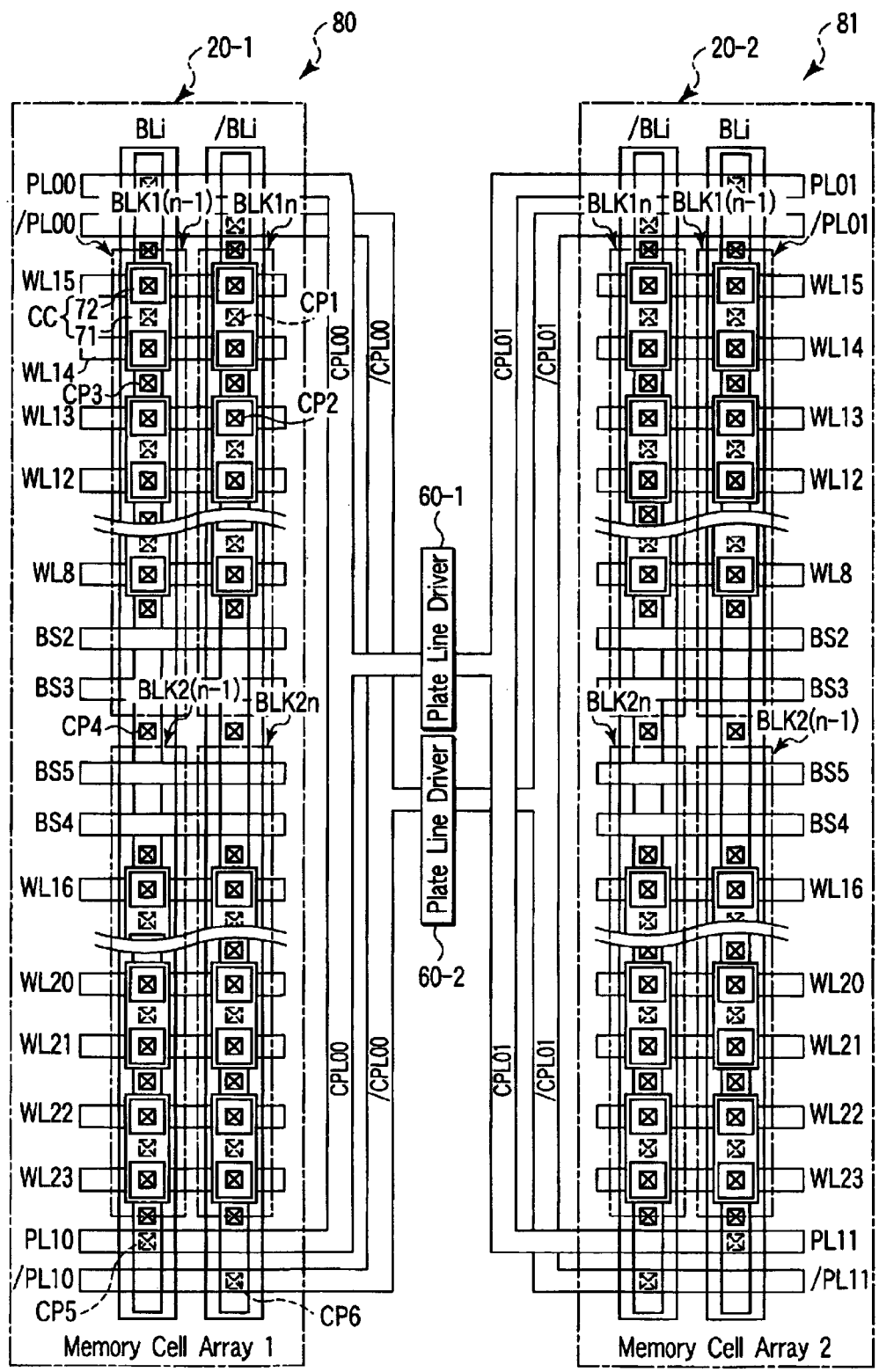
FIG. 11 is a plan view of the memory cell arrays of the ferroelectric memory according to the third embodiment of the present invention.

FIG. 11 is a plan view showing part of each of the memory cell arrays 20-1 and 20-2 and more particularly showing a plane pattern of a boundary section between the circuit blocks 80 and 81.

As shown in FIGS. 10 and 11, the plane patterns of the circuit blocks 80 and 81 are similar to that in the first embodiment, and the common plate line CPL0 shown in FIG. 3 is replaced with the common plate line CPL00 or CPL01 and the common plate line /CPL0 is replaced with the common plate line /CPL00 or /CPL01. The descriptions of the circuit blocks 80 and 81 are therefore omitted. The circuit blocks 80 and 81 are almost symmetrical with regard to the two plate line drivers 60-1 and 60-2. The plate line drivers 60-1 and 60-2 are provided between the circuit blocks 80 and 81. The common plate lines CPL00 and CPL01 are connected to the plate line driver 60-1 and the common plate lines /CPL00 and /CPL01 are connected to the plate line driver 60-2.

The above Series connected TC unit type ferroelectric RAM according to the third embodiment performs the same read operation as that of the ferroelectric memory according to the second embodiment.

As described above, the ferroelectric memory according to the third embodiment can produce both the advantages of the first and second embodiments.

As described in the second embodiment, a plate line driver is provided for each plate line in each memory cell array. In the example shown in FIG. 9, the required number of plate line drivers is eight that is the same as the number of plate lines.

In the ferroelectric memory according to the third embodiment, however, two plate lines are connected to a common plate line in each circuit block. A plate line driver is provided for every two common plate lines between two memory cell arrays. In other words, one plate line driver is shared by four plate lines between two memory cell arrays, or one plate line driver has only to be provided for every four-row memory cell blocks included in each memory cell array. Furthermore, in other words, eight-row memory cell blocks are connected to each other by a single plate line. The number of plate line drivers can thus be reduced to one-fourth that in the prior art ferroelectric memory; consequently, the chip size can be decreased.

If one plate line driver is shared by a plurality of plate line drivers as described in the first and second embodiments, the wiring capacity and wiring resistance, which cause the load of the plate line drivers, increase. In the ferroelectric memory of the third embodiment, however, the load of the plate line drivers due to the capacity of the cell capacitors does not change from that in the prior art memory, as in the first and second embodiments. This is because two memory cell arrays that share the use of a plate line driver are not selected at the same time. Furthermore, the memory cell blocks that share the use of a plate line driver in the same memory cell array are not selected at the same time in read mode. Therefore, an increase in the load of the plate line drivers, which is due to the sharing of a plate line driver by a plurality of plate lines, is simply caused by the wiring resistance and wiring capacitance only. Consequently, the area of the plate line drivers occupied in the chip can greatly be reduced with a minimal increase in the load of the plate line drivers and thus the chip can be decreased in size.

The wiring pattern of the plate lines and common plate lines has only to be formed such that one plate line driver can be shared by four plate lines. For example, the wiring pattern can be formed as shown in FIG. 12. More specifically, a plate line PL0 in each of memory cell arrays 20-1 and 20-2 is formed of a metal wiring layer that is shaped like a stripe along the first direction. The same is true of the plate lines PL1, /PL0 and /PL1. The common plate lines CPL00, /CPL00, CPL01 and /CPL01 are each formed of a metal wiring layer that is shaped like a stripe along the second direction. This pattern can produce the same advantage as that of the third embodiment.

Figure 13:
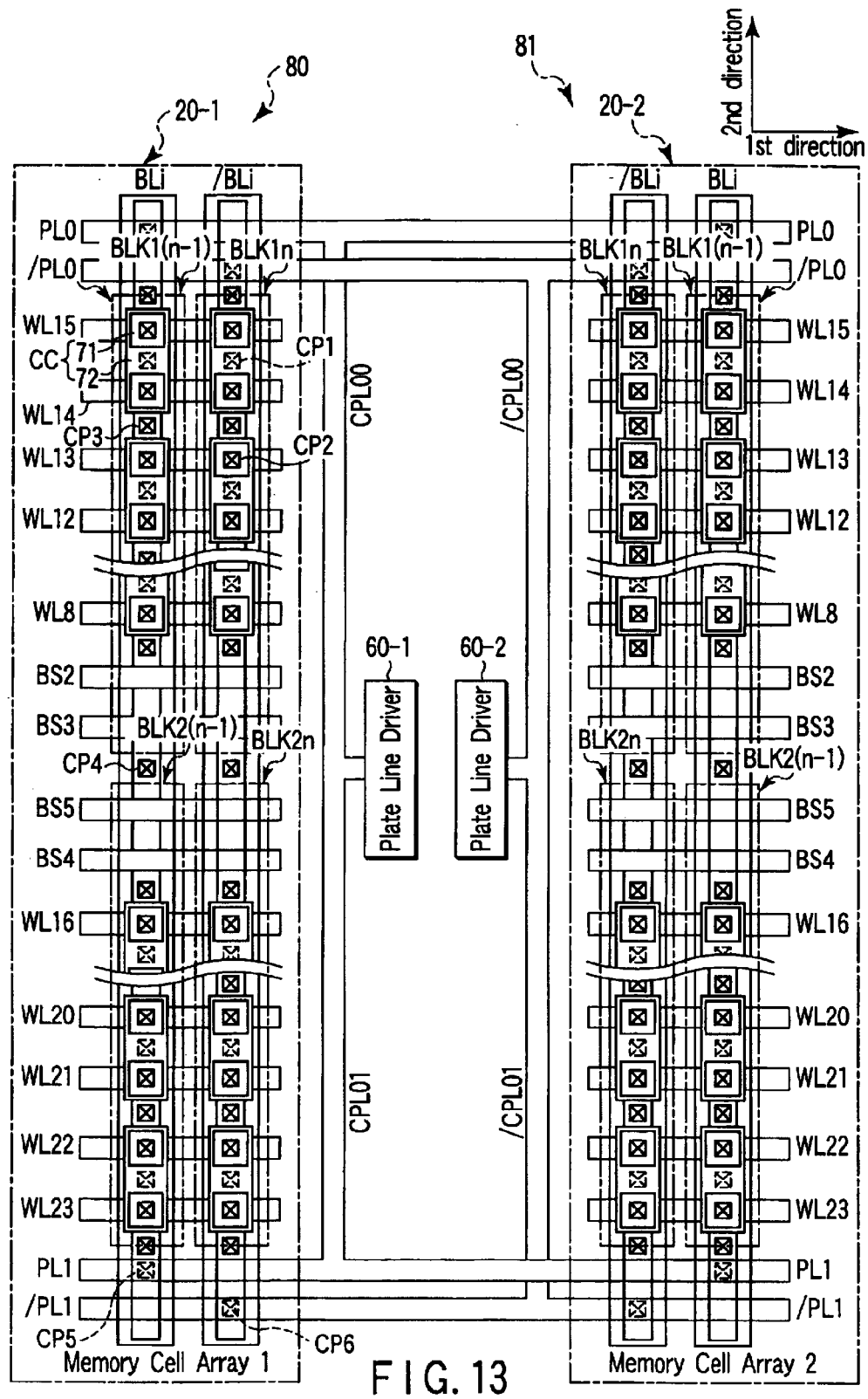
FIG. 13 is a plan view of memory cell arrays of a ferroelectric memory according to a second modification to the third embodiment of the present invention.

As illustrated in FIG. 13, the common plate lines CPL00 and CPL01 can be connected to each other and then to the plate line driver 60-1, while the common plate lines /CPL00 and /CPL01 can be connected to each other and then to the plate line driver 60-2.

In the third embodiment described above, two plate lines share the use of a plate line driver in each memory cell array. Three or more plate lines can share the use of a plate line driver in each memory cell array. Further, the number of plate lines that share the use of a plate line driver can vary from memory cell array to memory cell array. In the third embodiment, two memory cell arrays share the use of a plate line driver; however, three or more memory cell arrays can share the use of a plate line driver.

As described above, according to the first to third embodiments, a plurality of memory cell blocks that are not selected at the same time in read mode are connected to a common plate line. In other words, these memory cell blocks share the use of one plate line driver. In a non-selected memory cell, the word line is set at a high level and thus both ends of a cell capacitor are short-circuited. Therefore, the capacity of the cell capacitor in the non-selected memory cell does not contribute to the parasitic capacitance of the plate line. Consequently, the number of plate line drivers can be reduced with a minimal increase in the load of the plate line drivers and the chip can be decreased in size accordingly.

Figure 14:
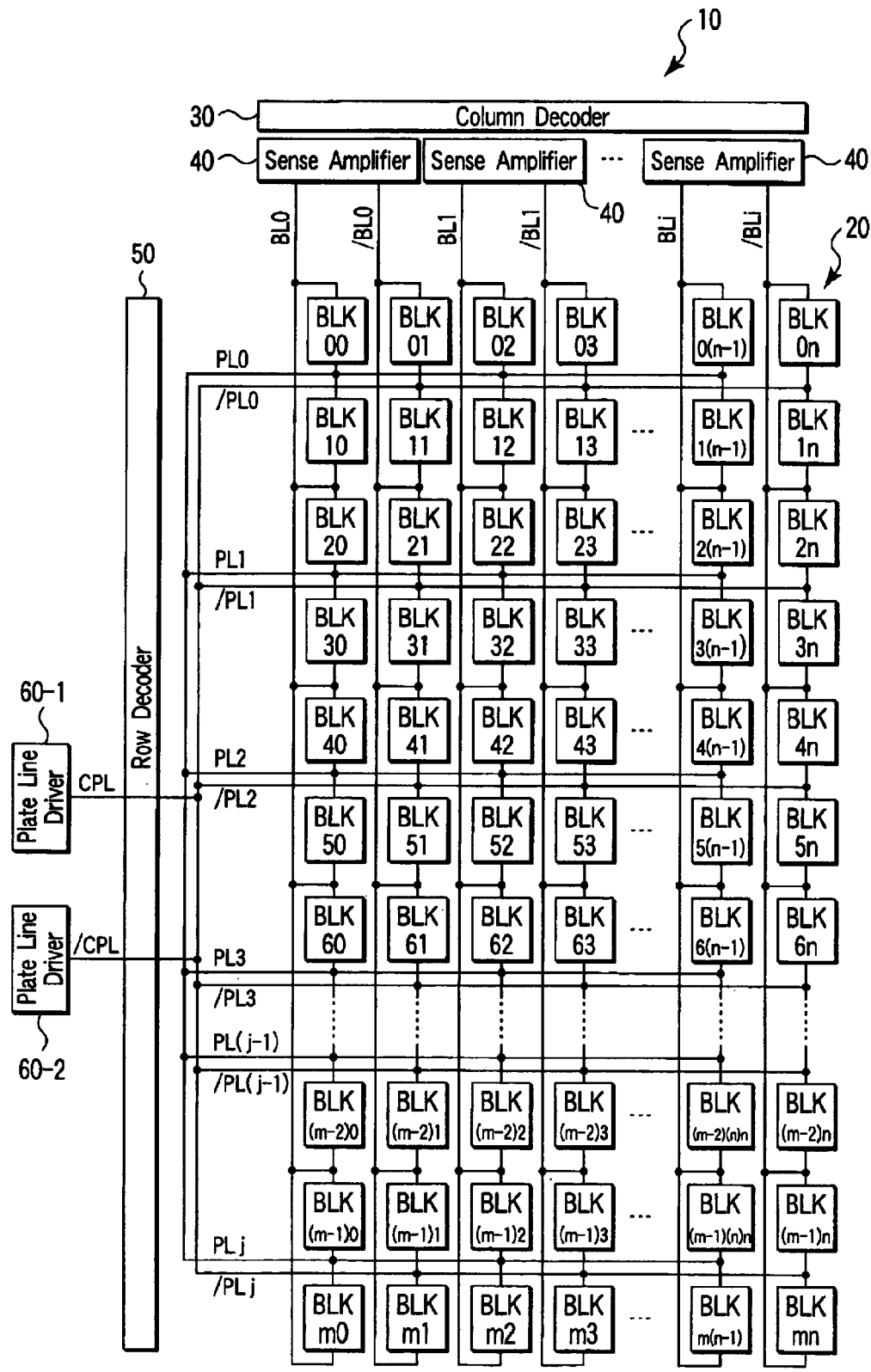
FIG. 14 is a block diagram of a ferroelectric memory according to a first modification to the first to third embodiments.

In the first to third embodiments, two or three plate lines per memory cell array share the use of one plate line driver. As shown in the block diagram of FIG. 14, however, all plate line pairs PL0 and /PL0, . . . , PLj and /PLj (j is a natural number) can be connected to their corresponding common plate line pairs and then to plate line drivers 60-1 and 60-2, respectively.

In the first to third embodiments, one data is held in two memory cells. It is needless to say that one data can be held in one memory cell. This can be achieved in a Series connected TC unit type ferroelectric RAM shown in the block diagram of FIG. 15.

Referring to FIG. 15, (m+1)×(n+1) memory cell blocks are arranged in matrix to form a memory cell array 20. The memory cell blocks in the respective rows are connected at one end to bit lines BL0 to BLn. The other ends of memory cell blocks in adjacent two rows are connected to one of plate lines PL0 to PLj (j=(m−1)/2). Pairs of adjacent plate lines are connected to common plate lines CPL0 to CPLk (k=(j−1)/2). Moreover, the common plate lines CPL0 to CPLk are connected to plate line drivers 60-1 to 60-(k+1), respectively.

Figure 17:
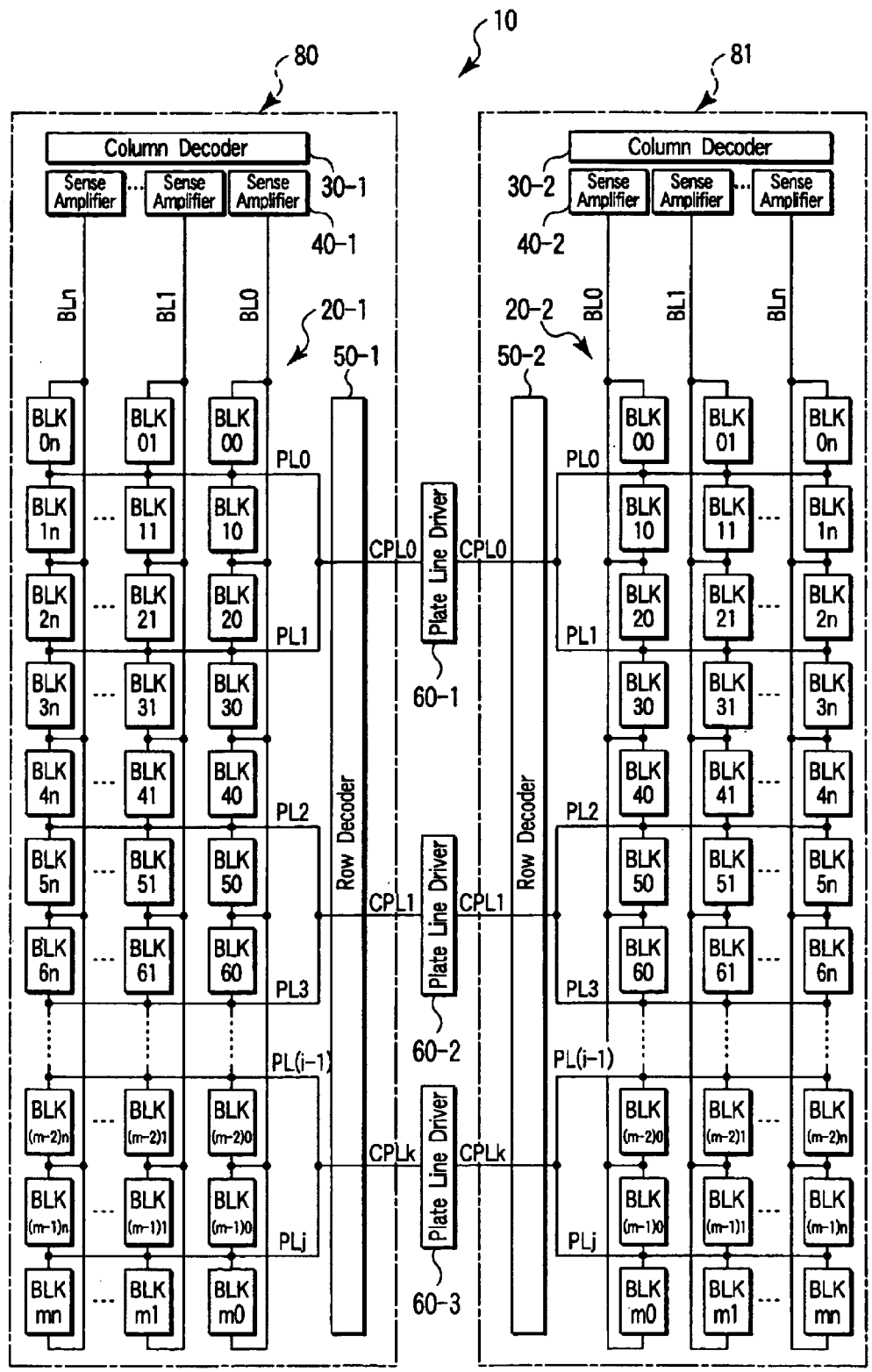
FIG. 17 is a block diagram of a ferroelectric memory according to a fourth modification to the first to third embodiments.

The first to third embodiments can be applied to the case where one data is held in one memory cell as described above. Needless to say, three or more plate lines can share the use of one plate line driver. As shown in the block diagram of FIG. 16, all plate lines PL0 to PLj can share the use of a plate-line driver 60. In this case, one plate line driver is enough for each memory cell array. Furthermore, as shown in the block diagram of FIG. 17, a plurality of memory cell arrays can share the use of plate line drivers 60-1 to 60-3.

According to the above-described embodiments, the chip size can be decreased. This is advantageous from the viewpoint of high degree of integration and the like when a logic LSI and a ferroelectric memory according to the above embodiments are embedded on a single semiconductor chip.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
   unit cells each including a cell transistor and a ferroelectric capacitor connected between a source and a drain of the cell transistor;
   memory cell blocks each including the unit cells connected in series between a first terminal and a second terminal and a block select transistor connected between the second terminal and a third terminal;
   bit lines each of which connects commonly the third terminals of the memory cell blocks, the bit lines extending along a first direction;
   sense amplifiers provided in correspondence to the bit lines and configured to amplify data supplied to the bit lines;
   word lines each of which connects commonly gates of cell transistors in the memory cell blocks;
   block select signal lines each of which connects commonly gates of block select transistors in the memory cell blocks;
   plate lines each of which connects commonly the first terminals of the memory cell blocks, the plate lines extending along a second direction perpendicular to the first direction, and the memory cell blocks connected to one of the plate lines being connected to different ones of the sense amplifiers; and
   a plate line driver to which a plurality of the plate lines are connected and which applies a potential to the plate lines.

2. The device according to claim 1, wherein the plate line driver includes first and second driver circuits, and
   the memory cell blocks connected to each of the plate lines connected to the first and second driver circuits respectively are connected to different word lines and different block select signal lines.

3. The device according to claim 1, wherein the bit lines include first and second bit line groups,
   the word lines include first and second word line groups,
   the block select signal lines include first and second block select signal line groups,
   the device further comprises:
      first and second column decoders which select any of the bit lines from the first and second bit line groups, respectively;
      first row decoder which selects any of the word lines and any of the block select signal lines from the first word line group and first block select signal line group, respectively; and
      second row decoder which selects any of the word lines and any of the block select signal lines from the second word line group and second block select signal line group, respectively,
   the second column decoder and the second row decoder are inoperative when the first column decoder and the first row decoder operative, and the first column decoder and the first row decoder are inoperative when the second column decoder and the second row decoder are operative, the plate line driver includes first and second driver circuits, the memory cell blocks connected to the plate lines connected to the first driver circuit are selected by the first column decoder and the first row decoder, and the memory cell blocks connected to the plate lines connected to the second driver circuit are selected by the second column decoder and the second row decoder.

4. A semiconductor integrated circuit device comprising:

unit cells each including a cell transistor and a ferroelectric capacitor connected between a source and a drain of the cell transistor;

memory cell blocks each including the unit cells connected in series between a first terminal and a second terminal and a block select transistor connected between the second terminal and a third terminal;

a first memory cell array in which the memory cell blocks are arranged in matrix;

first word lines each of which connects commonly gates of cell transistors in the same row in the first memory cell array;

first block select signal lines each of which connects commonly gates of block select transistors in the same row in the first memory cell array;

first bit lines each of which connects commonly the third terminals of memory cell blocks in the same column in the first memory cell array;

sense amplifiers provided in correspondence to the bit lines and configured to amplify data supplied to the bit lines;

first plate lines each of which connects commonly the first terminals the memory cell blocks in the same row in the first memory cell array, the memory cell blocks connected to one of the first plate lines being connected to different ones of the sense amplifiers;

a first row decoder which selects the first word line and the first block select signal line;

a first column decoder which selects the first bit line; and a plate line driver to which a plurality of the first plate lines are electrically connected and which applies a potential to the first plate lines.

5. The device according to claim 4, further comprising:

a first common plate line which connects commonly the first plate lines, wherein the plate line driver applies the potential to the first plate lines via the first common plate line.

6. The device according to claim 5, further comprising:

element regions formed in a first direction and each shaped like a stripe extending along a second direction perpendicular to the first direction, wherein:

the first word line extends over the element regions and is shaped like a stripe extending along the first direction;

the first block select signal line extends over the element regions, and is formed adjacent to the first word line in the second direction and shaped like a stripe extending along the first direction;

the first bit line is shaped like a stripe extending along the second direction;

the first plate line extends over the element regions, and is formed opposite to the first block select signal line with the first word line interposed therebetween and shaped like a stripe extending along the first direction; and at least part of the first common plate line is connected to one end of the first plate line and formed in the second direction at an end portion of the first memory cell array, and the first common plate line is connected to the plate line driver.

7. The device according to claim 4, wherein only memory cell blocks connected to any one of the first plate lines are selected in read mode.

8. The device according to claim 4, further comprising:

a second memory cell array in which the memory cell blocks are arranged in matrix;

second word lines electrically separated from the first word line and each of which connects commonly gates of cell transistors in the same row in the second memory cell array;

second block select signal lines electrically separated from the first block select signal line and each of which connects commonly gates of block select transistors in the same row in the second memory cell array;

second bit lines electrically separated from the first bit line and each of which connects commonly the third terminals of memory cell blocks in one column in the second memory cell array;

second plate lines each of which connects commonly the first terminals of at least one of memory cell blocks in at least one row in the second memory cell array;

a second row decoder which selects the second word line and the second block select signal line in the second memory cell array; and a second column decoder which selects the second bit line in the second memory cell array, wherein the plate line driver is electrically connected to the first and second plate lines to apply a potential to the first and second plate lines.

9. The device according to claim 8, wherein only memory cell blocks included in one of the first and second memory cell arrays are selected in read mode.

10. The device according to claim 8, wherein the plate line driver is electrically connected to a plurality of second plate lines to apply a potential to the second plate lines.

11. The device according to claim 10, further comprising:

a second common plate line which connects commonly the second plate lines, wherein the plate line driver applies the potential to the second plate lines via the second common plate line.

12. The device according to claim 11, further comprising:

first element regions formed in a first region in a semiconductor substrate in a first direction;

second element regions formed in a second region in the semiconductor substrate in the first direction, the first and second element regions being each shaped like a stripe extending along a second direction perpendicular to the first direction, wherein:

the first and second word lines extends over the first and second element regions and each is shaped like a stripe extending along the first direction;

the first block select signal line extends over the first element regions, and is formed adjacent to the first word line in the second direction and shaped like a stripe extending along the first direction;

the second block select signal line extends over the second element regions, and is formed adjacent to the second word line in the second direction and shaped like a stripe extending along the first direction;

the first and second bit lines are formed on the first and second regions, respectively and each shaped like a stripe extending along the second direction;

the first plate line extends over the first element regions, and is formed opposite to the first block select signal line with the first word line interposed therebetween and shaped like a stripe extending along the first direction;

the second plate line extends over the second element regions, and is formed opposite to the second block select signal line with the second word line interposed therebetween and shaped like a stripe extending along the first direction;

at least part of the first common plate line is connected to one end of the first plate line and formed in the second direction at an end portion of the first region;

at least part of the second common plate line is connected to one end of the second plate line and formed in the second direction at an end portion of the second region; and the first and second common plate lines are connected to the plate line driver in a boundary region between the first and second regions.

13. The device according to claim 10, wherein only memory cell blocks connected to any one of the second plate lines are selected in read mode.

* * * * *